United States Patent
Jeong et al.

(10) Patent No.: US 10,551,735 B2
(45) Date of Patent: Feb. 4, 2020

(54) PELLICLE COMPOSITION FOR PHOTOMASK, PELLICLE FOR PHOTOMASK FORMED FROM THE PELLICLE COMPOSITION, METHOD OF FORMING THE PELLICLE, RETICLE INCLUDING THE PELLICLE, AND EXPOSURE APPARATUS FOR LITHOGRAPHY INCLUDING THE RETICLE

(71) Applicant: Samsung Electronics Co., Ltd., Suwon-si, Gyeonggi-do (KR)

(72) Inventors: Seongjun Jeong, Hwaseong-si (KR); Hyeonjin Shin, Suwon-si (KR); Sangwon Kim, Seoul (KR); Seongjun Park, Seoul (KR); Minsu Seol, Seoul (KR); Dongwook Lee, Suwon-si (KR); Yunseong Lee, Osan-si (KR); Alum Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/946,087

(22) Filed: Apr. 5, 2018

(65) Prior Publication Data

US 2019/0033704 A1 Jan. 31, 2019

(30) Foreign Application Priority Data

Jul. 27, 2017 (KR) .......................... 10-2017-0095713

(51) Int. Cl.
*G03F 7/20* (2006.01)
*G03F 1/62* (2012.01)
*G03F 1/22* (2012.01)

(52) U.S. Cl.
CPC .................. *G03F 1/62* (2013.01); *G03F 1/22* (2013.01); *G03F 7/70008* (2013.01); *G03F 7/70983* (2013.01)

(58) Field of Classification Search
CPC ....... G03B 27/58; G03F 1/62; G03F 7/70833; G03F 7/70825; G03F 1/64; H01L 21/683
See application file for complete search history.

(56) References Cited

U.S. PATENT DOCUMENTS 7,288,299 B2 10/2007 Tregub et al.
9,599,912 B2 3/2017 Osorio Oliveros
(Continued)

FOREIGN PATENT DOCUMENTS

EP 3 321 734 A1 5/2018
EP 3 330 796 A1 6/2018
(Continued)

OTHER PUBLICATIONS

Ji Eun Kim, et al. "Feasibility study on graphene-embedded EUV pellicle," The 6th International Conference on Microelectronics and Plasma Technology, (2016).
(Continued)

*Primary Examiner* — Mesfin T Asfaw
(74) *Attorney, Agent, or Firm* — Harness, Dickey & Pierce, P.L.C.

(57) ABSTRACT

A pellicle composition for a photomask, a pellicle for a photomask, the pellicle for a photomask being formed from the pellicle composition, a method of forming the pellicle, a reticle including the pellicle, and an exposure apparatus for lithography including the reticle are provided. The pellicle composition includes: at least one selected from graphene quantum dots and a graphene quantum dot precursor, the graphene quantum dots having a size of about 50 nm or less; and a solvent.

29 Claims, 10 Drawing Sheets

(56) References Cited

U.S. PATENT DOCUMENTS

| | | |
|---|---|---|
| 9,690,190 B2 | 6/2017 | Kim et al. |
| 2009/0081594 A1* | 3/2009 | Chen .................. G03F 1/62 |
| | | 430/322 |
| 2010/0035061 A1* | 2/2010 | Mason ................ B81C 99/008 |
| | | 428/403 |
| 2013/0250260 A1 | 9/2013 | Singh |
| 2014/0160455 A1 | 6/2014 | Yakunin et al. |
| 2016/0147141 A1* | 5/2016 | Ono ..................... G03F 1/24 |
| | | 430/5 |
| 2016/0161857 A1* | 6/2016 | Levinson ............. G03F 1/22 |
| | | 355/67 |
| 2017/0096600 A1 | 4/2017 | Tour et al. |
| 2018/0004082 A1 | 1/2018 | Song et al. |
| 2018/0149966 A1 | 5/2018 | Shin et al. |
| 2018/0259844 A1 | 9/2018 | Shin et al. |

FOREIGN PATENT DOCUMENTS

| | | |
|---|---|---|
| JP | 2015-018228 A | 1/2015 |
| WO | WO-2014/020003 A1 | 2/2014 |
| WO | WO-2016/116329 A1 | 7/2016 |

OTHER PUBLICATIONS

Extended European Search Report dated Dec. 19, 2018 issued in European Patent Application No. 18177983.6.
McConnell, et al. "Thermal Conductivity of Doped Polysilicon Layers," Journal of Microelectromechanical Systems, vol. 10, No. 3, (2001).

* cited by examiner

PELLICLE COMPOSITION FOR PHOTOMASK, PELLICLE FOR PHOTOMASK FORMED FROM THE PELLICLE COMPOSITION, METHOD OF FORMING THE PELLICLE, RETICLE INCLUDING THE PELLICLE, AND EXPOSURE APPARATUS FOR LITHOGRAPHY INCLUDING THE RETICLE

CROSS-REFERENCE TO RELATED APPLICATION

This application claims the benefit of Korean Patent Application No. 10-2017-0095713, filed on Jul. 27, 2017, in the Korean Intellectual Property Office, the disclosure of which is incorporated herein in its entirety by reference.

BACKGROUND

Inventive concepts relate to a pellicle composition for a photomask, a pellicle for a photomask, formed from the pellicle composition, a method of forming the pellicle, a reticle including the pellicle, and an exposure apparatus for lithography including the reticle.

A pellicle for a photomask may be provided as a film on the photomask to protect the photomask from external contaminants such as dust or resist during optical lithography processes. Such a pellicle for a photomask is desired to have high transmittance with respect to light used in lithography, excellent heat dissipation characteristics, high strength, high durability, and high stability.

Following the trends toward a reduced line width of a semiconductor device or electronic circuit, there is an increasing desire for a shorter wavelength of light that can be used in a lithography process to implement such reduced line widths, and for pellicle materials suitable for a light source used in the lithography process.

SUMMARY

Provided is a pellicle composition for a photomask.

Provided are a pellicle for a photomask, including the pellicle composition, and a method of forming the pellicle.

Provided is a reticle including the pellicle.

Provided is an exposure apparatus for lithography including the reticle.

Additional aspects will be set forth in part in the description which follows and, in part, will be apparent from the description, or may be learned by practice of the presented embodiments.

According to an example embodiment of inventive concepts, a pellicle composition for a photomask includes a graphene quantum dot compound, and a solvent. The graphene quantum dot compound includes at least one selected from graphene quantum dots having a size of about 50 nm or less or a graphene quantum dot precursor.

According to an example embodiment of inventive concepts, a pellicle for protecting a photomask includes a pellicle membrane including a product obtained by coating and thermally treating the above-described pellicle composition.

According to an example embodiment of inventive concepts, a method of forming a pellicle for a photomask, the pellicle including a pellicle membrane, includes providing the above-described pellicle composition for a photomask onto a substrate and thermally treating the pellicle composition to form the pellicle membrane on the substrate; and etching away a central region of the substrate supporting the pellicle membrane, such that the pellicle membrane remains.

According to an example embodiment of inventive concepts, a reticle includes a photomask; and the above-described pellicle.

According to an example embodiment of inventive concepts, an exposure apparatus for lithography includes: a light source configured to emit light; and the above described reticle, wherein the reticle is located in a path of light emitted from the light source, the reticle including a pattern to be transferred onto a substrate; and a pellicle configured to protect the photomask.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
FIGS. 1 to 4 are cross-sectional views illustrating a structure of a pellicle for a photomask, according to example embodiments.

Reference will now be made in detail to embodiments, examples of which are illustrated in the accompanying drawings, wherein like reference numerals refer to like elements throughout. In this regard, example embodiments may have different forms, and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of a pellicle composition for a photomask, a pellicle for photomask formed from the pellicle composition, a method of forming the pellicle, a reticle including the pellicle, and an exposure apparatus for lithography including the reticle will be described in greater detail.

According to an aspect of the inventive concept, a pellicle composition for a photomask includes: at least one first element selected from graphene quantum dots (hereinafter also referred to as GQDs) having a size of about 50 nm or less and a graphene quantum dot precursor; and a solvent.

The GQDs may have at least one defect.

When the "GQDs have at least one defect" as herein, the at least one defect may include a defect in which an $sp^2$ carbon includes a structural defect of an $sp^3$ carbon due to binding of a molecule to the surface of GQDs via a covalently bound functional group, a defect from induction of an $sp^3$ carbon-hydrogen (C—H) functional group onto the surface of the GQDs due to a reduction reaction such as hydrogenation, and/or a structural defect such as a carbon vacancy induced by hydrogenation, which is associated with a D peak at around 1350 $cm^{-1}$ in the Raman spectra.

The GQDs having at least one defect may have at least one selected from an $sp^3$ carbon and a carbon vacancy.

The GQDs may have at an edge thereof at least one functional group selected from the group consisting of a hydroxyl group, a carbonyl group, a carboxyl group, an epoxy group, an amine group and an imide group; or a functional group including at least one heteroatom selected from oxygen and nitrogen. When such a functional group as described above is introduced, the GQDs may further include an $sp^3$ carbon, in addition to an $sp^2$ carbon. Consequently, the GQDs may have at least one defect.

Crystalline characteristics of GQDs may be a typical parameter that defines physical properties of the GQDs. Analyzing a structural defect of the GQDs is important. As a molecule is fixed onto a surface of GQDs by introducing a covalently binding functional group, a structural defect of $sp^3$ C may occur to $sp^2$ C in graphene crystals.

In the term "graphene quantum dots" used herein, "graphene" may refer to a sheet structure of a single atomic layer formed by a carbon nanostructure that forms polycyclic aromatic molecules in which a plurality of carbon atoms are covalently bound and aligned in a planar shape; a network structure in which a plurality of carbon nanostructures as a small film having a plate shape are interconnected and aligned in a planar shape; or any combination thereof. The covalently bound carbon atoms may form 6-membered rings as repeating units, but may further include 5-membered rings and/or 7-membered rings. The graphene may be formed by stacking a plurality of layers including several sheet structures and/or network structures.

The GQDs may include 300 layers or less, and in some embodiments, 100 layers or less, and in some other embodiments, 1 layer to 20 layers. The GQDs may have a thickness of about 100 nm or less, and in some embodiments, about 10 nm or less, and in some other embodiments, about 0.01 nm to about 10 nm, and in still other embodiments, about 0.34 nm to about 10 nm. The GQDs may have a 2-dimensional sheet form with a size to thickness ratio of, for example, about 3 to about 30, and in some embodiments, about 5 to about 25.

The GQDs may be in the form of particles or a sheet. The term "size" of the GQDs may refer to an average particle diameter when the GQDs are spherical, and may refer to a length of the major axis when the GQDs are non-spherical.

When the GQDs are in the form of a sheet, the size, e.g. a length of the major axis, of the GQDs may be, for example, about 50 nm or less, and in some embodiments, about 30 nm or less, and in some other embodiments, about 0.1 nm to about 30 nm, and in still other embodiments, about 0.1 nm to about 10 nm, and in yet still other embodiments, about 5 nm to about 10 nm. A length of the minor axis of the GQDs may be about 0.5 nm to about 5 nm. The GQDs may have monodispersed particle size distribution characteristics.

When the size, the number of layers, and the thickness of the GQDs are within the above-described ranges, the pellicle composition may have improved stability. The GQDs may include, for example, about 100 to about 60,000 conjugated atoms, and in some embodiments, about 100 to about 600 conjugated atoms.

The GQDs may have a 2-dimensional layered structure having a peak from the (002) crystal plane, as supported by results of X-ray diffraction analysis with CuKα radiation. The peak from the (002) crystal plane may appear at about 20° to about 27°. The GQDs according to embodiments may have a peak from the (002) crystal plane at about 20° to about 27°, and an interlayer distance (d-spacing) of about 0.3 nm to about 0.5 nm, for example, about 0.372 nm (3.72 Å), which is greater relative to graphite, due to oxygen-containing groups of the GQDs.

The GQDs may be, for example, graphene quantum dots functionalized with a carboxyl group (COOH-functionalized GQDs) or graphene quantum dots functionalized with a hydroxyl group (OH-functionalized GQDs).

The COOH-functionalized GQDs may be obtained by adding chloroacetic acid to bare GQDs or OH-functionalized GQDs. The OH-functionalized GQDs may be obtained by a general method of introducing a hydroxyl group to GQDs. For example, the OH-functionalized GQDs may be obtained by grinding GQDs into a certain size, adding a base and an oxidizing agent to the ground GQDs, and then further grinding a resulting product. An example of the base may be sodium hydroxide. An example of the oxidizing agent may be hydrogen peroxide.

The GQDs may contain an edge carbon (edge C) existing at an edge site and a center carbon (center C) existing at a center site. The edge carbon may have an $sp^3$ binding structure, and the center carbon may have an $sp^2$ binding structure. Since a functional group, e.g., oxygen or nitrogen, may be bound to the edge carbon, the edge carbon may have a higher reactivity to an etching solution relative to the center carbon.

In the GQDs according to one or more embodiments, an amount of the edge carbon may be about 20 atom % or less, for example, in a range of about 1.2 atom % to about 19.1 atom %.

The amounts of the edge carbon and the center carbon in the GQDs may be calculated based on the length of carbon-carbon bonds.

In the GQDs according to example embodiments, an amount of oxygen may be in a range of about 0.1 atom % to about 50 atom %, an amount of carbon may be in a range of about 30 atom % to about 99 atom %, and an amount of hydrogen may be in a range of about 0.1 atom % to about 40 atom %. Alternatively, an amount of oxygen may be in a range of about 0.1 atom % to about 50 atom %, an amount of carbon may be in a range of about 30 atom % to about 99 atom %, an amount of nitrogen may be in a range of about 0.5 atom % to about 40 atom %, and an amount of hydrogen may be in a range of about 0.1 atom % to about 40 atom %.

In the GQDs according to embodiments, the amount of hydrogen may be in a range of, for example, about 3.2 atom % to about 22.8 atom %, and the amount of nitrogen may be in a range of, for example, about 1.04 atom % to about 5 atom %.

The amounts of oxygen, nitrogen, and hydrogen in the GQDs may be analyzed by Rutherford backscattering spectroscopy. When the amount of oxygen in the GQDs is within any of the above-described ranges, the GQDs may have hydrophilic property, and thus may have an improved adhesive strength to another layer. The GQDs may also have improved dispersibility in a solvent, and preparing the pellicle composition according to embodiments may become easier. In addition, etching resistance to an etching gas may be improved due to a high bond dissociation energy of the functional group including oxygen atom. As a mixed ratio of carbon and oxygen is within any of the above-described ranges, a bond breakage may be suppressed due to an increased carbon-carbon binding energy of the GQDs. Accordingly, using the pellicle composition according to embodiments including such GQDs, a pellicle membrane with improved ultimate strength characteristics may be obtained. The pellicle membrane may have improved binding strength to adjacent layers. Accordingly, the pellicle membrane having an improved ultimate strength may also be formed as a free-standing film.

An amount of the at least one of the graphene quantum dots and a graphene quantum dot precursor may be in a range of about 0.1 wt % to about 40 wt %, for example, about 1 wt % to about 10 wt %, based on a total weight of the pellicle composition. When the amount of the at least one of the graphene quantum dots and a graphene quantum dot precursor is within these ranges, a pellicle with increased transmittance, e.g. increased extreme ultraviolet (EUV) transmittance, and improved ultimate strength characteristics may be obtained.

In the pellicle composition according to embodiments, the GQDs may exhibit peaks at about 1340-1350 cm$^{-1}$, about 1580 cm$^{-1}$, and about 2700 cm$^{-1}$ in the Raman spectra. These peaks provide information of a thickness, a crystallinity, and/or a charge doping status of the GQDs. The peak observed at about 1,580 cm$^{-1}$ is a "G-mode" peak, which is generated in a vibration mode corresponding to stretching of a carbon-carbon bond. Energy of the "G-mode" is determined according to the density of an excess of charges doped in the GQDs. The peak observed at about 2,700 cm$^{-1}$ is a "2D-mode" peak that may be useful in evaluating the thickness of the GQDs. The peak observed at about 1,340 cm$^{-1}$ to about 1,350 cm$^{-1}$ is a "D-mode" peak, which appears when a sp$^2$ crystal structure has defects and which is mainly observed when many defects are in a sample or around edges of the sample. An intensity ratio of a D peak to a G peak (a D/G intensity ratio) may provide information of a degree of disorder of crystals in the GQDs.

The graphene quantum dots may have, as analyzed by Raman spectroscopy, an intensity ratio ($I_D/I_G$) of a D mode peak to a G mode peak of about 0.5 or greater, for example, about 0.872 to about 0.946, and an intensity ratio ($I_{2D}/I_G$) of a 2D mode peak to a G mode peak of about 0.01 or greater, and further, about 0.05 or greater, and further, about 0.1 or greater, and in still other embodiments, about 0.05 to about 2.5. When the intensity ratio of a D mode peak to a G mode peak and the intensity ratio of a 2D mode peak to a G mode peak are within any of these ranges, the GQDs may have a relatively high crystallinity and a relatively small defect, and thus an increased binding energy. Accordingly, a pellicle membrane formed using the GQDs may have improved characteristics, and in particular, in terms of durability.

In some embodiments, the GQDs may have a peak from the (002) crystal plane at about 20° to about 27°, as analyzed by X-ray diffraction analysis, and an interlayer distance (d-spacing) of about 0.3 nm to about 0.5 nm, for example, about 0.372 nm (3.72 7), which is greater relative to graphene due to oxygen-containing groups in the GQDs. Using the GQDs having a interlayer distance (d-spacing) within these ranges, a pellicle membrane with improved ultimate strength may be obtained.

In the pellicle composition according to embodiments, the GQDs may have a higher content of sp$^2$ carbon relative to sp$^3$ carbon and a relatively high content of oxygen. A sp$^2$ carbon bond is include in an aromatic structure, may have a higher binding energy than a sp$^3$ carbon bond. The sp$^3$ structure is a 3-dimensional (3D) binding structure as a regular tetrahedron of carbons, as in diamond. The sp$^2$ structure is a 2D binding structure of graphite having an increased ratio of carbon to hydrogen (a C/H ratio), thus ensuring resistance to dry etching.

As used herein, the "graphene quantum dot (GQD) precursor" may refer to a starting material that may be used to prepare the GQDs. For example, the GQD precursor may be or may include 1,3,6-trinitropyrene.

As used herein, the "graphene quantum dot compound" may refer to either a material corresponding to a graphene quantum dot, or to a material corresponding to a graphene quantum dot precursor.

In some embodiments, the solvent of the pellicle composition may be or may include at least one selected from water, methanol, isopropanol, ethanol, N,N-dimethylformamide, N-methyl-2-pyrrolidone, dichloroethane, dichlorobenzene, dimethylsulfoxide, xylene, aniline, propylene glycol, propylene glycol diacetate, 3-methoxy-1,2-propanediol, diethylene glycol, acetylacetone, cyclohexanone, propylene glycol monomethyl ether acetate, γ-butyrolactone, nitromethane, tetrahydrofuran, nitrobenzene, butyl nitrite, methyl cellosolve, ethyl cellosolve, diethylether, diethylene glycol methyl ether, diethylene glycol ethyl ether, dipropylene glycol methyl ether, toluene, hexane, methylethylketone, methyl isopropylketone, hydroxymethylcellulose, propylene glycol methyl ether acetate (PGMEA), and heptane.

The pellicle composition may further include at least one first material selected from a two-dimensional (2D) carbon nanostructure, a zero-dimensional (0D) carbon nanostructure, a 2D carbon nanostructure precursor, and a 0D carbon nanostructure precursor. The pellicle composition may also further include at least one second material selected from an aromatic ring-containing monomer and a polymer containing a repeating unit including the aromatic ring-containing monomer. The pellicle composition may also further include at least one third material selected from the group consisting of a hexagonal boron nitride derivative, a chalcogenide material, a hexagonal boron nitride derivative precursor, and a chalcogenide material precursor. The pellicle composition may also further include at least one fourth material selected from a silicon derivative and a metal oxide. The pellicle composition may include any combination of the above.

The 2D carbon nanostructure may be or may include at least one selected from graphene, reduced graphene oxide, a derivative of any of the graphene and the reduced graphene oxide, and a heteroatom derivative of any of the graphene and the reduced graphene oxide. The 0D carbon nanostructure may be or may include at least one selected from fullerene, boron buckyball, carborane, and a derivative of any of the fullerene, the boron buckyball, and the carborane.

When the pellicle composition according to embodiments further include a first material, a second material, a third material, a fourth material, or a combination thereof as described above, a mixed ratio of the GQDs to the first material, second material, third material, fourth material or a combination thereof as an additional ingredient may be about 1:1 to about 1:20 by weight, and in some embodiments, about 1:1 to about 1:10 by weight, and in some other embodiments, about 1:2 to about 1:8 by weight, and in still other embodiments, about 1:3 to about 1:5 by weight.

The GQDs which are compact in a pellicle formed using the pellicle composition according to embodiments may be observed by transmission electron microscopy (TEM).

Using the pellicle composition according to embodiments, a large-area pellicle may be formed at reduced costs. The pellicle is obtained by coating and thermally treating the pellicle composition for a photomask. Thermal treatment of the pellicle composition may be performed at a temperature of about 200° C. to 2,000° C., for example, at about 800° C. to 1500° C.

The thermal treatment time may vary depending on the thermal treatment temperature. For example, the thermal treatment time may be 1 minute to about 1 hour when the thermal treatment is performed at a temperature of about 400° C. to about 1000° C.

A pellicle membrane formed using the pellicle composition according to embodiments may have a width of tens to hundreds of millimeters (mm) and a length of tens to hundreds of millimeters (mm). The thickness of the pellicle membrane may be about 150 nm or less or about 100 nm or less. For example, the thickness of the pellicle membrane may be about 100 nm or less, and in some embodiments, about 5 nm to about 100 nm, and in some other embodiments, about 10 nm to about 100 nm, and in still other embodiments, about 5 nm to about 50 nm.

The pellicle membrane after the thermal treatment may be subject to rear etching. The rear etching may improve uniformity of the pellicle membrane, relative to a transfer method. The rear etching may prevent or reduce drawbacks of the transfer method, such as wrinkle formation or damage in the pellicle membrane.

According to an example embodiment of inventive concepts, a pellicle for protecting a photomask includes a pellicle membrane containing a product obtained by coating and thermally treating the pellicle composition according to any of the above-described embodiments.

The product obtained by coating and thermally treating the pellicle composition may include at least one selected from the above-described graphene quantum dots and a reaction product thereof.

In the pellicle according to embodiments, in terms of a mixed ratio of $sp^2$ carbon to $sp^3$ carbon in the product obtained by coating and thermal treatment of the pellicle composition, a $sp^2$ carbon content may be, for example, about 98% to about 99% by weight, and a $sp^3$ carbon content may be, for example, about 1% to about 2% by weight.

As used herein, the terms "reaction product of the GQDs" may refer to a product obtained by thermally treating the GQD-containing pellicle composition according to embodiments. The thermal treatment product of the GQD-containing pellicle composition may have a reduced oxygen content and an increased carbon content relative to the GQDs as a starting material. The oxygen content in the reaction product of the GQDs may be lower by about 5% or less, for example, about 3.7%, and the carbon content in the reaction product of the GQDs may be higher by about 15% or greater, for example, about 25%, relative to the GQDs as a starting material.

In some example embodiments, in the at least one element selected from the GQDs and a reaction product thereof, the amounts of oxygen, hydrogen, carbon, and nitrogen may be the same or differ from those in the pellicle composition.

For example, when in the at least one element selected from the GQDs and a reaction product thereof, the amounts of oxygen, hydrogen, carbon, and nitrogen differ from those in the pellicle composition, the amount of oxygen may be in a range of about 0.1 atom % to about 40 atom %, the amount of carbon may be in a range of about 59 atom % to about 99 atom %, for example, 70 atom % to about 99 atom %, and the amount of hydrogen is in a range of about 0.1 atom % to about 10 atom %.

Alternatively, the amount of oxygen may be in a range of about 0.1 atom % to about 40 atom %, the amount of carbon may be in a range of about 59 atom % to about 99 atom %, for example, about 70 atom % to about 99 atom %, the amount of nitrogen may be in a range of about 0.5 atom % to about 40 atom %, and the amount of hydrogen may be in a range of about 0.1 atom % to about 40 atom %.

In the at least one element selected from the GQDs and a reaction product thereof, the amount of hydrogen may be in a range of, for example, about 3.2 atom % to about 5 atom %, and the amount of nitrogen may be in a range of, for example, about 1.04 atom % to about 5 atom %.

In some embodiments, the pellicle may have an extreme-ultraviolet (EUV) transmittance of about 70% or greater and a transmittance uniformity of about 5% or less, and in some embodiments, about 3% or less, and in some other embodiments, about 1% or less.

For example, the pellicle membrane of the pellicle may have a density of about 1.3 $g/cm^3$ to about 2.5 $g/cm^3$, and in some embodiments, about 1.5 $g/cm^3$ to about 2.3 $g/cm^3$, and in some other embodiments, about 1.8 $g/cm^3$ to about 2.2 $g/cm^3$, and may have an ultimate strength of about 200 MPa or greater, and in some embodiments, about 300 MPa or greater, and in some other embodiments, about 300 MPa to about 2,000 MPa. The ultimate strength is the maximum stress that the pellicle membrane can withstand. The ultimate strength may also be called tensile strength. When the pellicle membrane has a density and an ultimate strength within the above-described ranges, the pellicle membrane may have improved durability and be free of cracking or damage. In some example embodiments, the pellicle may further include a pellicle frame in an edge region of the photomask, the pellicle frame supporting the pellicle membrane.

In some example embodiments, at least one element selected from a passivation layer and a protective layer may be on at least one surface of the pellicle membrane.

In some example embodiments, the pellicle may further include an adhesive layer between the pellicle membrane and the pellicle frame.

The pellicle according to embodiments may be utilized in lithography, for example extreme ultraviolet (EUV) lithography.

According to another aspect of the inventive concept, a method of forming a pellicle for a photomask, the pellicle including a pellicle membrane, includes providing the pellicle composition for a photomask onto a substrate and thermally treating the pellicle composition to form the pellicle membrane on the substrate, and etching away a center region of the substrate supporting the pellicle membrane, leaving the pellicle membrane.

The providing of the pellicle composition onto the substrate may be performed using a method selected from spin coating, screen printing, a doctor-blade process, spray coating, electrospraying, dip coating, and bar coating.

The thermal treating may be performed at a temperature of about 200° C. to about 2000° C., and in some embodiments, about 500° C. to about 1000° C., and in some other embodiments, about 800° C. to about 1000° C. The product resulting from the thermal treating of the pellicle composition may have a reduced oxygen content, an increased carbon content, and an increased density relative to the GQDs as a starting material. After the thermal treatment, the oxygen content in the pellicle may be reduced by about 5% or less, for example, about 3.7%, and the carbon content in the pellicle may be increased by about 15% or greater, for example, about 25%, relative to before the thermal treatment.

FIGS. 1 to 4 are cross-sectional views illustrating a structure of a pellicle for a photomask according to embodiments.

Referring to FIG. 1, a pellicle 10 for a photomask may include a pellicle membrane 11, and a substrate 14 which is bound to an edge region of the pellicle membrane 11, serving as a pellicle frame supporting the pellicle membrane 11. A first passivation layer 12 and a second passivation layer 13 may be on opposite surfaces of the pellicle membrane 11, respectively, as illustrated in FIG. 1. In some embodiments, the first passivation layer 12 or the second passivation layer 13 may be on a surface of the pellicle membrane 11, as illustrated in FIGS. 2 and 3.

Figure 2:
Figure 3:

Although not illustrated in FIGS. 1 to 3, in addition to the first or second passivation layer, a protective layer (not shown) may be further on at least one surface of the pellicle membrane 11. The protective layer may include at least one selected from Ru, Mo, Si, Zr, B, C, SiN, TiN, and $HfO_2$ (hafnium oxide). The protective layer may suppress damage caused by reaction of hydrogen present in EUV equipment to the pellicle membrane. When the pellicle 10 further includes such a protective layer, the pellicle 10 may have improved mechanical and chemical characteristics, and may have improved durability.

Figure 4:
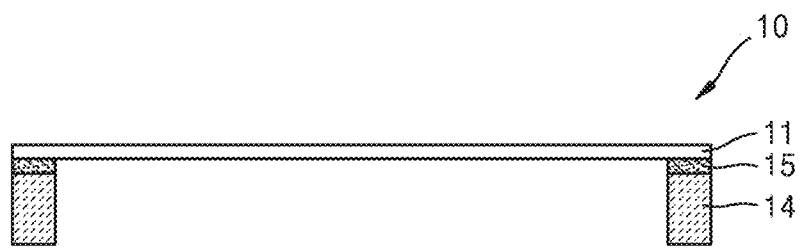

Referring to FIG. 4, a pellicle 10 according to an embodiment may further include a barrier layer 15 between the pellicle membrane 11 and the substrate 14. The barrier layer 15 may be an adhesive layer stably binding the pellicle membrane 11 and the substrate 14. The barrier layer 14 may include, for example, at least one of silicon oxide ($SiO_2$), silicon nitride ($Si_3N_4$), titanium nitride (TiN), and tantalum nitride (TaN).

In the embodiment of FIG. 4, the pellicle 10 may further include the first passivation layer 12 and/or the second passivation layer 13, as illustrated in FIGS. 1 to 3, and/or a protective layer as described above on the pellicle membrane 11.

Figure 5A:
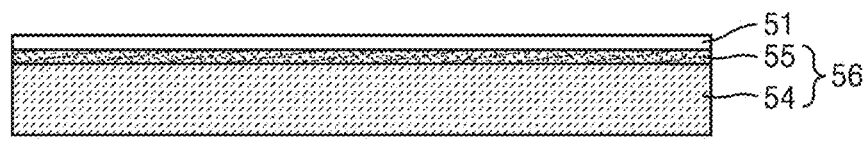
FIGS. 5A and 5B illustrate a method of forming a pellicle, according to example embodiments.
Figure 5B:
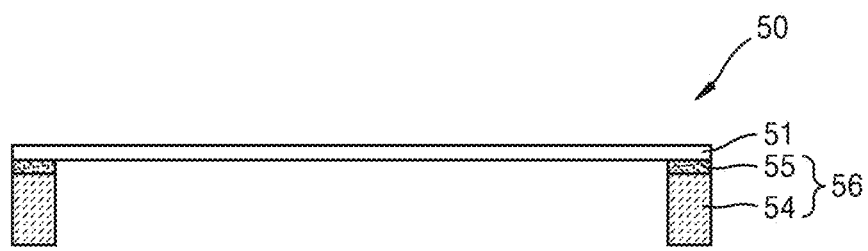

FIGS. 5A and 5B illustrate a method of forming a pellicle step by step according to embodiments.

Referring to FIG. 5A, a barrier layer 55 may be formed on a substrate 54.

The substrate 54 may be formed of or may include, for example, silicon (Si), glass, quartz, or alumina. A pellicle composition according to any of the above-described embodiments may be applied onto the barrier layer 55 and then thermally treated to form a pellicle membrane 51, resulting in a stacked structure.

The stacked structure with the pellicle membrane 51 may then be subjected to rear etching to etch away the barrier layer 55 and the substrate 54 supporting a center region of the pellicle membrane 51. The rear etching may be performed using a method including mechanical etching, dry etching and wet etching. As a result of the etching, the substrate 54 and the barrier layer 55 may support an edge region of the pellicle membrane 51. For example, the substrate 54 and the barrier layer 55 may serve as a frame 56 supporting the pellicle membrane 51.

The rear etching may be performed using an etching method commonly used in the art, for example, reactive ion etching (RIE), a method using $XeF_2$, and/or a method of using HF gas. Using these etching methods, the substrate 54 and the barrier layer 55 may be easily etched into a desired pattern without damaging the pellicle membrane 51.

In some embodiments, the rear etching may include a first etching step using re active ion etching (RIE) and $XeF_2$ and a second etching step using HF gas. This two-step rear etching may maintain the pellicle membrane 51 as a uniform thin film nearly without damage during the etching.

Although not illustrated, a protective layer may be further formed on at least one surface of the pellicle membrane 51. The protective layer may further enhance the durability of the pellicle membrane 51 and minimize deformation of the pellicle membrane 51 caused by heat accumulation. The protective layer may provide the pellicle membrane 51 with improved physical and chemical durability to prevent damage from exposure to extreme ultraviolet (EUV) light for a certain period of time or longer or damage due to a surface cleaning process.

Figure 6:
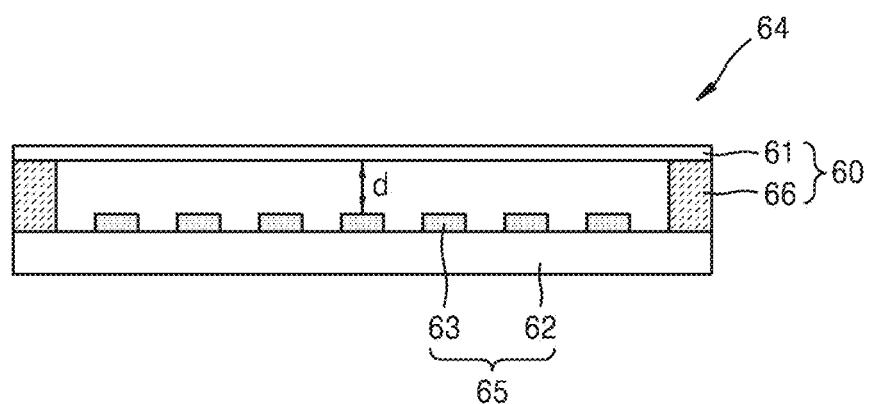
FIG. 6 is a schematic cross-sectional view illustrating a structure of a reticle according to an example embodiment.

FIG. 6 is a cross-sectional view illustrating a reticle 64 including a pellicle for a photomask, according to an example embodiment. Referring to FIG. 6, the reticle 64 may include a photomask 65 and a pellicle 60. The photomask 65 may include a mask substrate 62 and a mask pattern 63 on the mask substrate 62. The shape, size, and interval of the mask pattern 63 in FIG. 6 are only for illustrative purposes and may be variously changed.

The pellicle 60 may include a pellicle membrane 61 separated from the mask pattern 63. Although the pellicle membrane 61 is simply illustrated for convenience, the pellicle membrane 61 may have any of the structures described above with reference to FIGS. 1 to 4 or any modified structure thereof.

The pellicle 60 may further include a pellicle frame 66 that is in an edge region of the photomask 65, supporting the pellicle membrane 61. The photomask 65 and the pellicle membrane 61 may be separated from one another by a distance (d) by the pellicle frame 66. In other words, the photomask 65 may be separated from the pellicle membrane 61 by a distance (d) by the pellicle frame 66. For example, the distance (d) may be about 15 mm or less, and in some embodiments, about 1 mm to about 10 mm. Although not illustrated, an adhesive layer (not shown) may be between the pellicle membrane 61 and the pellicle frame 66. In some embodiments, an adhesive layer may be further between the pellicle frame 66 and the photomask 65.

The pellicle 60 may protect the photomask 65 from an external contaminant (for example, dust, resist, or the like). When using the pellicle 60, a problem arising during lithography without a pellicle, due to adhesion of foreign materials to the photomask 65, may be prevented.

Figure 7:
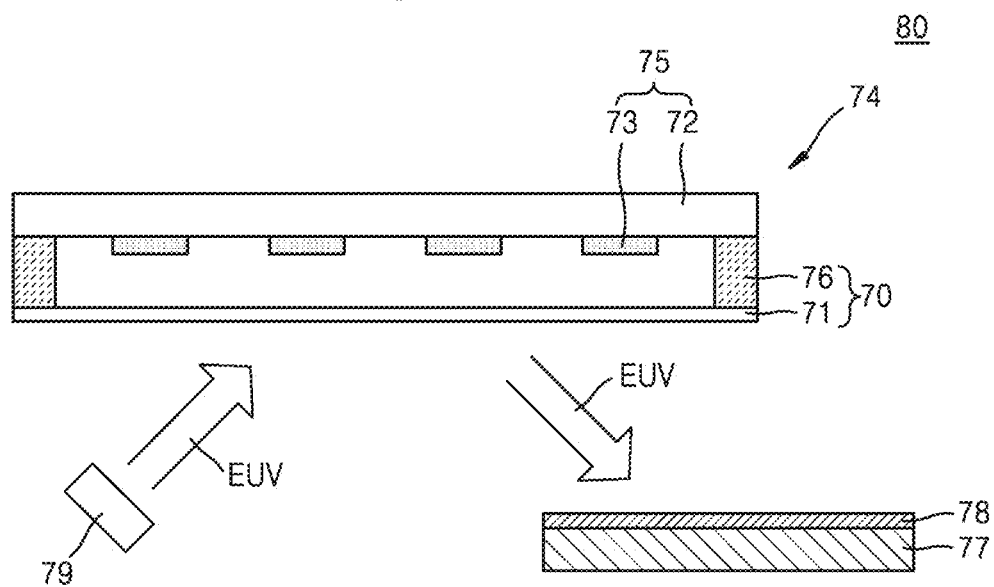
FIG. 7 is a schematic view of an exposure apparatus for lithography using a reticle, according to an embodiment.

FIG. 7 is a schematic view of an exposure apparatus for lithography using a reticle according to an embodiment including a pellicle according to any of the above-described embodiments.

Referring to FIG. 7, the exposure apparatus 80 for photolithography according to an embodiment may pattern a resist layer 78 formed on a substrate 77 using light having a certain wavelength. The exposure apparatus 80 may include an energy source. The energy source may include electromagnetic radiation. For example, the exposure apparatus 80 may include a light source 79 emitting light of a certain wavelength, a photomask 75 through which an exposure process is performed onto the resist layer 78 using the light emitted from the light source 79, and a pellicle 70 for protecting the photomask 75. However, inventive concepts are not limited thereto, and the energy source may be or may include an electron beam and/or an ion beam.

The light source 79 may emit light in a short wavelength region for forming a fine pattern onto the resist layer 78. In particular, the light source 79 may emit extreme-ultraviolet (EUV) light. The EUV light may have a wavelength of about 13.5 nm or less, for example, about 13.3 nm to about 13.5 nm.

The EUV light emitted from the light source 79 may be incident onto the reticle 74 according to an embodiment. The reticle 74 is a combined structure of the photomask 75 and the pellicle 70. Although not illustrated, an optical system, for example, a collimating lens which guides the EUV light emitted from the light source 79 such that the EUV light uniformly enters the reticle 74, may be further provided in an optical path between the light source 79 and the reticle 74.

The photomask 75 may be subjected to an exposure process using the EUV light emitted from the light source 79 onto the resist layer 78 formed on the substrate 77. The photomask 75 may include a mask substrate 72 and a mask pattern 73 of a predetermined shape on a surface of the mask substrate 72. The pellicle 70 may be provided under the mask substrate 72 of the photomask 75 to cover the mask pattern 73.

The photomask 75 may be a reflective photomask. In this case, the EUV light emitted from light source 79 may be transmitted through the pellicle 70 to enter the photomask 75. After being reflected from the photomask 75, the EUV light may be transmitted through the pellicle 70 and enter the resist layer 78 on the substrate 77. The mask substrate 72 may include a reflective layer reflecting the EUV light. The mask pattern 73 may include an absorption pattern absorbing the EUV light. Although not illustrated, an optical system, for example, a focusing lens which focuses the EUV light from the reticle 74 may be further provided in an optical path between the reticle 74 and the resist layer 78.

The pellicle 70 under the photomask 75 may protect the photomask 75 by preventing, or reducing the likelihood of, adsorption of an external contaminant such as dust, resist, or the like onto the photomask 75. To this end, the pellicle 70 may include a pellicle membrane 71 separated from the photomask 75 by a certain distance. The pellicle membrane 71 may be separated from the photomask 75 by about several millimeters (mm). For example, the pellicle membrane 71 may be separated from the photomask 75 by about 1 mm to about 10 mm. The distance (d) may be predetermined, or alternatively, desired, such that any particle on the pellicle may be out of focus and not exposed onto the substrate 77.

A pellicle frame 76 may be located between the pellicle membrane 71 and the photomask 75. In an exposure apparatus having a structure as described, during an exposure process, EUV light emitted from the light source 79 may enter the photomask 75 through the pellicle membrane 71, and the EUV light after reflected from the photomask 75 may enter the resist layer 78 formed on the substrate 77 through the pellicle membrane 71.

Although the photomask 75 used in the exposure apparatus of FIG. 7 according to an embodiment is a reflective photomask, embodiments of the inventive concept are not limited thereto. The photomask 75 may be a transmissive photomask. In this case, the mask substrate 72 may include a transmission layer which transmits incident light, and the mask pattern 73 may include an absorption pattern which absorbs the incident light.

The EUV light reflected in the reticle 74 may be incident onto the substrate 77. The substrate 77 may include a region, e.g. a layer to be patterned. For example, the substrate 77 may be a wafer including a resist layer (not shown). The EUV light reflected in the reticle 74 may be focused onto the resist layer, so that the mask pattern 73 may be transferred onto the substrate 77.

An optical member (not shown) may be at least one of between the light source 79 and the reticle 74 and between the reticle 74 and the substrate 77. For example, a first optical system (not shown) may be between the light source 79 and the reticle 74, and a second optical system (not shown) may be between the reticle 74 and the substrate 77. The first optical system may be or include an illumination optical system. For example, the first optical system may include at least one of a collimating lens and/or an alignment optical system. The light source 79 may be considered as being included in the illumination optical system. The second optical system may be a projection optical system. For example, the second optical system may include at least one reflection member and/or at least one lens. The structures of the first optical system and the second optical system may be variously changed. If needed, a lithography process may be performed while the reticle 74 and/or the substrate 77 are moved in a horizontal direction.

In the pellicle composition according to embodiments, a first material and a second material may be added as described above. Hereinafter, these materials will be described in more detail.

The first material may not be combined with the second material, or the first material may be combined to the second material by a chemical bond. The first material and the second material combined by a chemical bond may form a composite structure. The first material and the second material having the aforementioned functional groups may be bound to each other through a chemical bond.

The chemical bond may be, for example, a covalent bond. The covalent bond may include at least one selected from an ester group (—C(=O)O—), an ether group (—O—), a thioether group (—S—), a carbonyl group ((—C)=O)—), and an amide group (—C(=O)NH—).

The first material and the second material may include at least one selected from the group consisting of a hydroxyl group, a carboxyl group, an amino group, —Si($R_1$)($R_2$)($R_3$) (wherein $R_1$, $R_2$, and $R_3$ are each independently one of hydrogen, a hydroxyl group, a $C_1$-$C_{30}$ alkyl group, a $C_1$-$C_{30}$ alkoxy group, a $C_6$-$C_{30}$ aryl group, a $C_6$-$C_{30}$ aryloxy group, or a halogen atom), a thiol group (—SH), —Cl, —C(=O)Cl, —SCH$_3$, a glycidyloxy group, a halogen atom, an isocyanate group, an aldehyde group, an epoxy group, an imino group, a urethane group, an ester group, an amide group, an imide group, an acryl group, a methacryl group, —(CH$_2$)$_n$COOH (wherein n is an integer from 1 to 10), —CONH$_2$, a $C_1$-$C_{30}$ saturated organic group having a photosensitive functional group, and a $C_1$-$C_{30}$ unsaturated organic group having a photosensitive functional group.

For example, the aromatic ring-containing monomer may be a monomer represented by Formula 1:

[Formula 1]

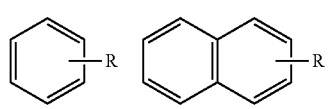

-continued

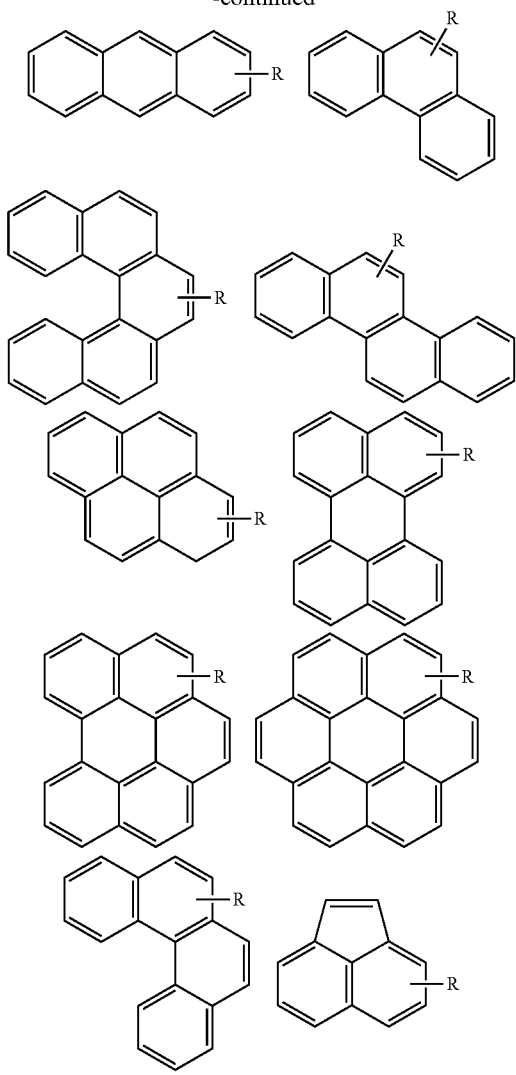

In Formula 1, R may be a mono-substituted or a multi-substituted substituent that is at least one selected from the group consisting of hydrogen, a halogen atom, a hydroxyl group, an isocyanate group, a glycidyloxy group, a carboxyl group, an aldehyde group, an amino group, a siloxane group, an epoxy group, an imino group, a urethane group, an ester group, an epoxy group, an amide group, an imide group, an acryl group, a methacryl group, a substituted or unsubstituted $C_1$-$C_{30}$ saturated organic group, and a substituted or unsubstituted $C_1$-$C_{30}$ unsaturated organic group.

The group R may be a general photosensitive functional group, in addition to the foregoing groups.

The $C_1$-$C_{30}$ saturated organic group and the $C_1$-$C_{30}$ unsaturated organic group may have a photosensitive functional group. Examples of the photosensitive functional group may include an epoxy group, an amide group, an imide group, a urethane group, and an aldehyde group.

Examples of the $C_1$-$C_{30}$ saturated organic group and the $C_1$-$C_{30}$ unsaturated organic group may include a substituted or unsubstituted $C_1$-$C_{30}$ alkyl group, a substituted or unsubstituted alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroaryloxy group, a substituted or unsubstituted $C_4$-$C_{30}$ carbocyclic group, a substituted or unsubstituted $C_4$-$C_{30}$ carbocyclic-oxy group, and a substituted or unsubstituted $C_2$-$C_{30}$ heterocyclic group.

In Formula 1, a binding site of R is not limited. Although only one R is included in Formula 1 for convenience of description, R may be substituted at any site where substitution is possible.

For example, the aromatic ring-containing monomer may be a monomer represented by Formula 2.

$$A\text{-}L\text{-}A'\qquad\qquad\text{[Formula 2]}$$

In Formula 2, A and A' may be identical to or different from one another and may independently be a monovalent organic group derived from one selected from the monomers represented by Formula 1; and The linker L may be a linker which may be a single bond or selected from the group consisting of a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_7$-$C_{30}$ arylene-alkylene group, a substituted or unsubstituted $C_6$-$C_{30}$ arylene group, a substituted or unsubstituted $C_2$-$C_{30}$ heteroarylene group, a substituted or unsubstituted $C_2$-$C_{30}$ heteroarylene-alkylene group, a substituted or unsubstituted $C_1$-$C_{30}$ alkylene-oxy group, a substituted or unsubstituted $C_7$-$C_{30}$ arylene-alkylene-oxy group, a substituted or unsubstituted $C_6$-$C_{30}$ arylene-oxy group, a substituted or unsubstituted $C_2$-$C_{30}$ heteroarylene-oxy group, a substituted or unsubstituted $C_2$-$C_{30}$ heteroarylene-alkylene-oxy group, —C(=O)—, and —$SO_2$—.

In L, the substituted $C_1$-$C_{30}$ alkylene group, the substituted $C_2$-$C_{30}$ alkenylene group, the substituted $C_2$-$C_{30}$ alkynylene group, the substituted $C_7$-$C_{30}$ arylene-alkylene group, the substituted $C_6$-$C_{30}$ arylene group, the substituted $C_2$-$C_{30}$ heteroarylene group, the substituted $C_2$-$C_{30}$ heteroarylene-alkylene group, the substituted $C_1$-$C_{30}$ alkylene-oxy group, the substituted $C_7$-$C_{30}$ arylene-alkylene-oxy group, the substituted $C_{65}$-$C_{30}$ arylene-oxy group, the substituted $C_2$-$C_{30}$ heteroarylene-oxy group, the substituted $C_2$-$C_{30}$ heteroarylene-alkylene-oxy group may be substituted with at least one substituent selected from a halogen atom, a hydroxyl group, an isocyanate group, a glycidyloxy group, a carboxyl group, an aldehyde group, an amino group, a siloxane group, an epoxy group, an imino group, a urethane group, an ester group, an epoxy group, an amide group, an imide group, an acryl group, and a methacryl group, or may be substituted with a photosensitive functional group.

The first material may be at least one selected from the group consisting of a compound represented by Formula 3 and a compound represented by Formula 4.

[Formula 3]

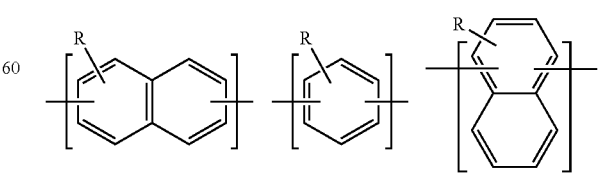

In Formula 3, R may be defined the same as in Formula 1.

[Formula 4]

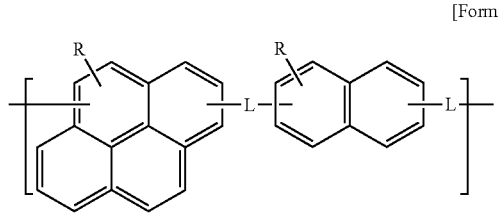

In Formula 4, R may be defined the same as in Formula 3, and L may be defined the same as in Formula 2.

In Formulae 3 and 4, a binding site of R is not limited. Although only one R is included in Formulae 3 and 4 for convenience of description, R may be substituted at any site where substitution is possible.

A weight average molecular weight of the polymer containing a repeating unit including an aromatic ring-containing monomer may be about 300 to about 30,000. When a polymer having a weight average molecular weight within this range is used, a thin film may be more easily formed, and a transparent hardmask may be manufactured.

In one or more embodiments, the first material may be a compound represented by Formula 5:

[Formula 5]

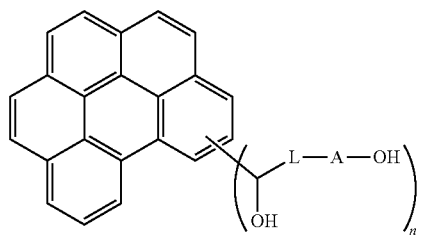

In Formula 5, A may be a substituted or unsubstituted $C_6$-$C_{30}$ arylene group; L may be a single bond or a substituted or unsubstituted $C_1$-$C_6$ alkylene group; and n may be an integer from 1 to 5.

The arylene group may be selected from groups of Group 1:

[Group 1]

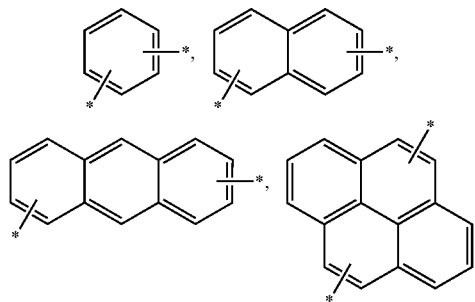

In some embodiments, the compound of Formula 5 may be one selected from compounds represented by Formulae 5a to 5c.

[Formula 5a]

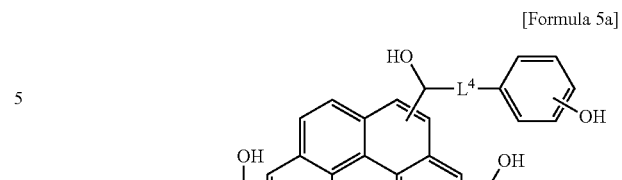

[Formula 5b]

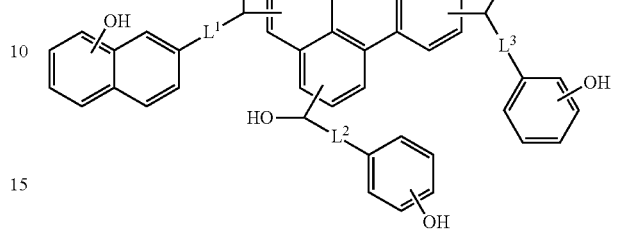

[Formula 5c]

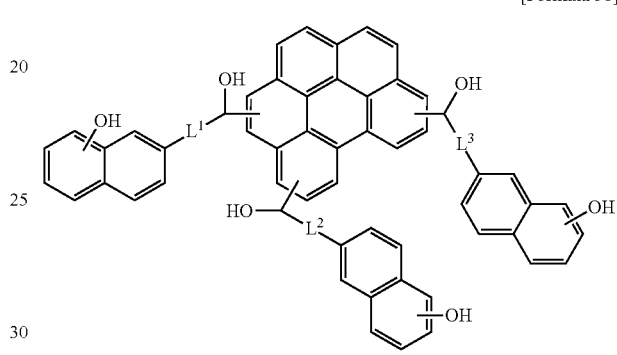

In Formulae 5a, 5b, and 5c, $L^1$ to $L^4$ may each independently be a single bond or a substituted or unsubstituted $C_1$-$C_6$ alkylene group.

The first material may be selected from compounds represented by Formulae 5d to 5f.

[Formula 5d]

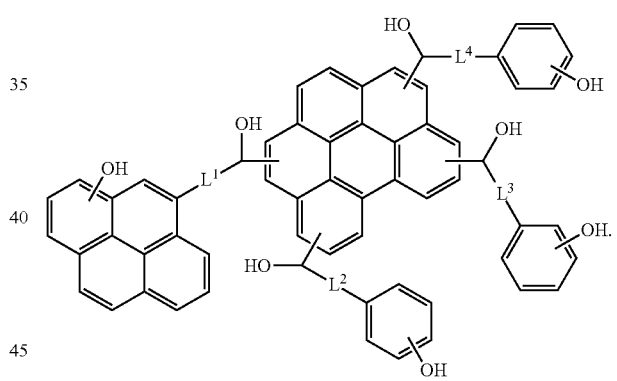

[Formula 5e]

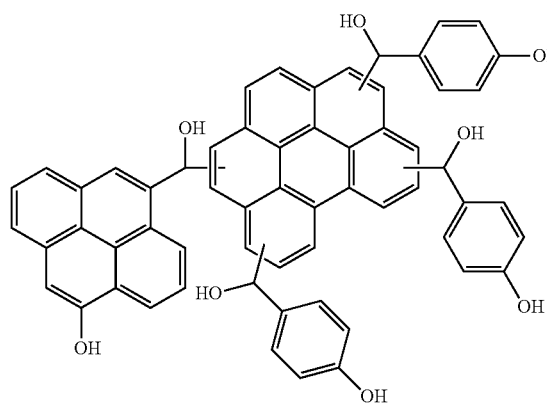

[Formula 5f]

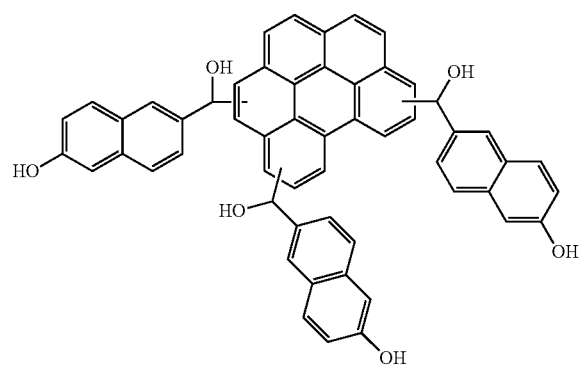

The first material may be a compound represented by Formula 6.

[Formula 6]

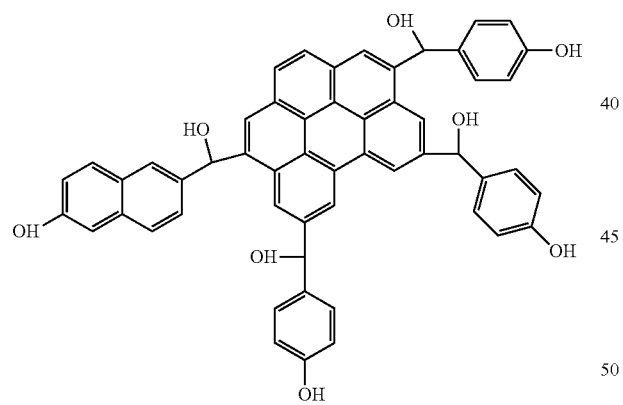

The first material may be a copolymer represented by Formula 7.

[Formula 7]

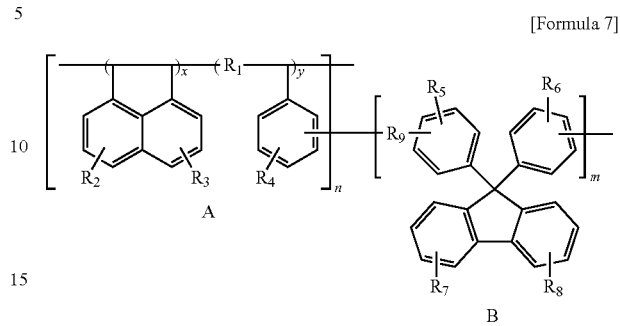

In Formula 7, $R_1$ may be a $C_1$-$C_4$ substituted or unsubstituted alkylene; $R_2$, $R_3$, $R_7$, and $R_8$ may each independently be hydrogen, a hydroxy group, a $C_1$-$C_{10}$ linear or branched cycloalkyl group, an $C_1$-$C_{10}$ alkoxy group, a $C_6$-$C_{30}$ aryl group, or a mixture thereof; $R_4$, $R_8$, and $R_6$ may each independently be hydrogen, a hydroxy group, a $C_1$-$C_4$ alkyl ether group, a phenyldialkylene ether group, or a mixture thereof; and $R_9$ may be an alkylene group, a phenyldialkylene group, a hydroxyphenylalkylene group, or a mixture thereof, wherein x and y may each independently be a mole fraction of two repeating units in part A which is about 0 to about 1, where x+y=1; n may be an integer from 1 to 200; and m may be an integer from 1 to 200.

The second material may be a polymer represented by Formula 7a, 7b or 7c.

[Formula 7a]

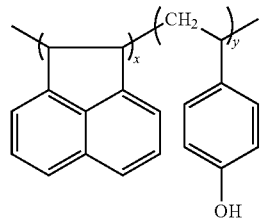

In Formula 7a, x may be 0.2, and y may be 0.8.

[Formula 7b]

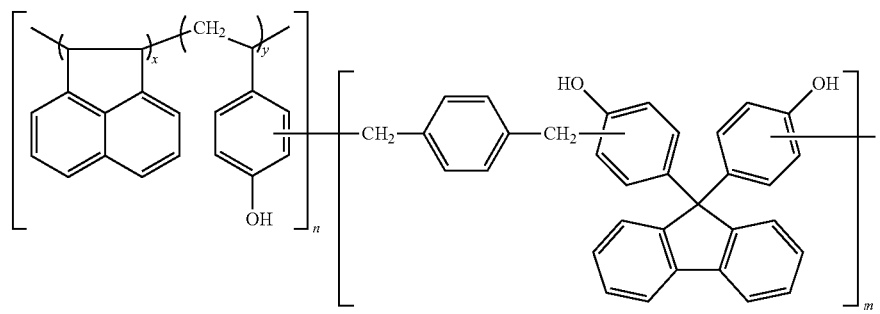

In Formula 7b, x may be 0.2, y may be 0.8, n=90, and m=10.

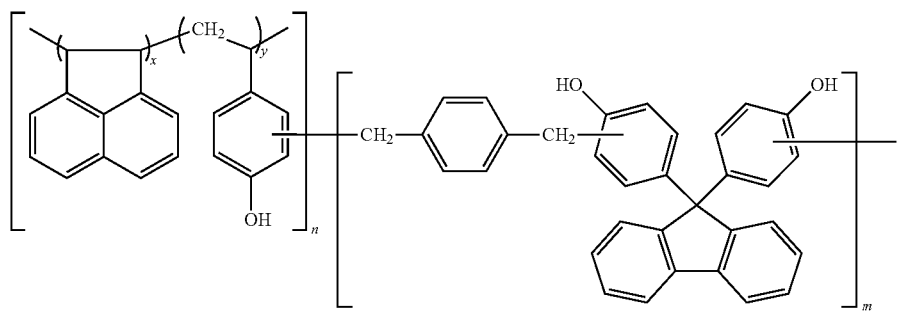
[Formula 7c]

In Formula 7c, x may be 0.2, y may be 0.8, n=90, and m=10.

The first material may be a copolymer represented by Formula 8 or 9:

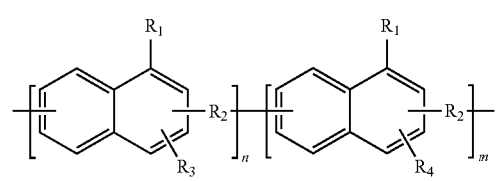
[Formula 8]

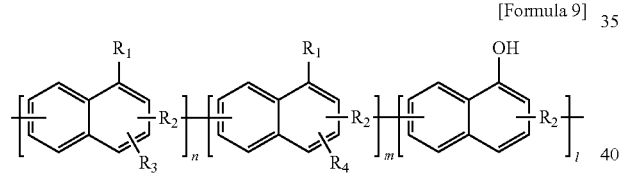
[Formula 9]

In Formulae 8 and 9, m and n may each independently be an integer from 1 to 190, $R_1$ may be one of hydrogen (—H), a hydroxy group (—OH), a $C_1$-$C_{10}$ alkyl group, a $C_6$-$C_{10}$ aryl group, an allyl group, and a halogen atom, $R_2$ may be one of a group represented by Formula 10, a phenylene group, a chrysenylene group, a pyrenylene group, a fluoroanthenylene group, an anthronylene group, a benzophenonylene group, a thioxanthonylene group, an anthracenylene group, and their derivatives; $R_3$ may be a conjugated diene group; and $R_4$ may be an unsaturated dienophile.

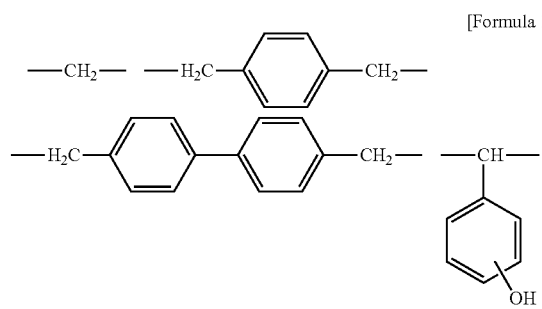
[Formula 10]

-continued $$-\overset{|}{\underset{|}{C}}H-$$
(phenyl)

In Formulae 8 and 9, $R_3$ may be, for example, a 1,3-butadienyl group, 2-methyl-1,3-cyclopentadiene group, 1-methyl-1,3-cyclopentadiene group or 5-methyl-1,3-cyclopentadiene group, and $R_4$ may be, for example, a vinyl group or a cyclopentenylmethyl group.

The copolymer may be a polymer selected from polymers represented by Formulae 11 to 14.

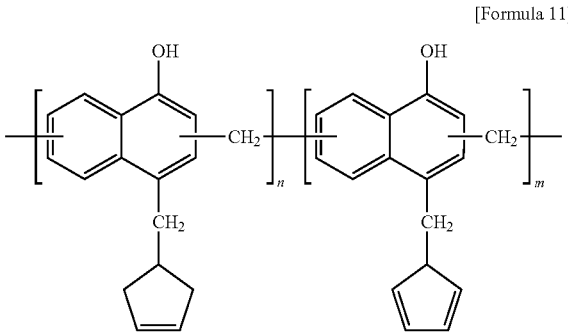
[Formula 11]

In Formula 11, m+n=21, a weight average molecular weight (Mw) may be about 10,000, and a polydispersity may be 2.1;

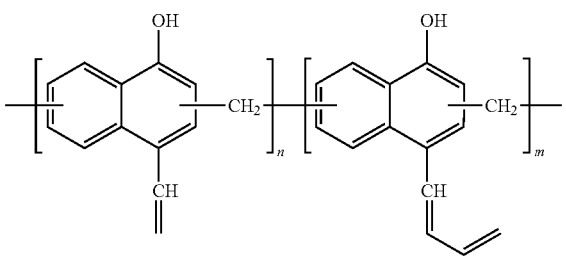
[Formula 12]

In Formula 12, a weight average molecular weight (Mw) may be about 11,000, a polydispersity (Mw) may be 2.1, and m+n=21.

[Formula 13]

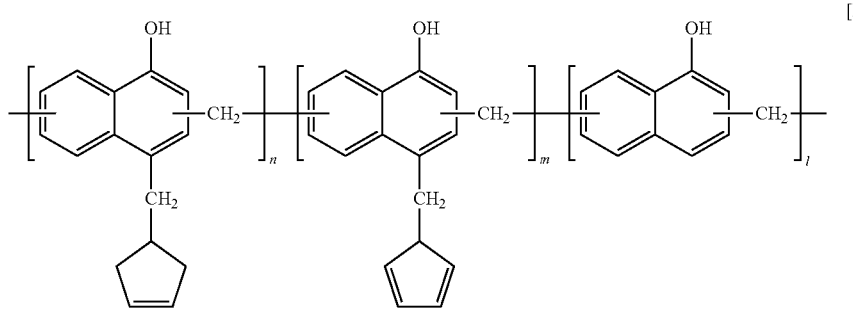

In Formula 13, a weight average molecular weight (Mw) may be about 10,000, a polydispersity may be 1.9, l+m+n=21, and n+m: l=2:1.

[Formula 14]

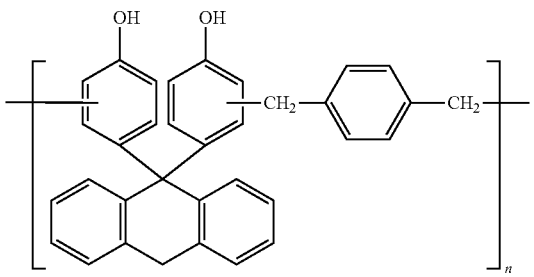

In Formula 14, a weight average molecular weight (Mw) may be about 10,000, a polydispersity may be about 2.0, and n may be about 20.

In the pellicle composition according to embodiments, the hexagonal boron nitride derivative is a hexagonal boron nitride (h-BN) or a hexagonal boron carbonitride (h-$B_xC_yN_z$) (wherein the sum of x, y, and z may be 3). In the hexagonal boron nitride derivative, boron and nitrogen atoms may be regularly included in a hexagonal ring, or some of the boron and nitrogen atoms may be substituted with carbon atoms while maintaining the form of a hexagonal ring.

In the pellicle composition according to embodiments, the metal chalcogenide material may be a compound including at least one Group 16 (chalcogenide) element and at least one electropositive element. For example, the metal chalcogenide material may include at least one metal element selected from molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge) and lead (Pb), and one chalcogenide element selected from sulfur (S), selenium (Se), and tellurium (Te).

The metal chalcogenide material may be selected from molybdenum sulfide ($MoS_2$), molybdenum selenide ($MoSe_2$), molybdenum telluride ($MoTe_2$), tungsten sulfide ($WS_2$), tungsten selenide ($WSe_2$), and tungsten telluride ($WTe_2$). In some embodiments, the metal chalcogenide material may be molybdenum sulfide ($MoS_2$).

The hexagonal boron nitride derivative may have a flat hexagonal crystal structure, the vertices of which are occupied alternatively by boron and nitrogen atoms. A layered structure of the hexagonal boron nitride derivative is a structure in which adjacent boron and nitrogen atoms overlap each other due to their polarities, which is also called "a AB stacking" structure. The hexagonal boron nitride derivative may have a layered structure of nanoscale thin sheets stacked one upon another, or may include a single layer or multiple layers of hexagonal boron nitride sheets separated or delaminated from the layered structure.

The hexagonal boron nitride derivative according to one or more embodiments may have a peak at about 1360 $cm^{-1}$ in the Raman spectra. This location of the peak may give information about the number of layers in the hexagonal boron nitride derivative. Through atomic force microscope (AFM) analysis, Raman spectroscopy analysis, transmission electron microscope (TEM) analysis, or the like, one may find that the hexagonal boron nitride derivative has a single-layered or multilayered nanosheet structure.

According to a result of X-ray diffraction analysis with CuKα radiation, the hexagonal boron nitride derivative may include a 2-dimensional (2D) layered structure having a (002) crystal plane peak. The (002) crystal plane peak may be observed in a range of about 20° to about 27°.

An interlayer distance (d-spacing) of the hexagonal boron nitride derivative obtained by X-ray diffraction analysis may be in a range of about 0.3 nm to about 0.7 nm, for example, about 0.334 nm to about 0.478 nm. An average diameter of crystals of the hexagonal boron nitride derivative obtained by X-ray diffraction analysis may be about 1 nm or greater, for example, in a range of about 23.7 Angstroms (Å) to about 43.9 Å. When the interlayer distance (d-spacing) is within this range, the pellicle composition may have improved etching resistance.

The hexagonal boron nitride derivative may include a single layer of 2D boron nitride or a stack of multiple layers of 2D boron nitride.

One or more embodiments of the present disclosure will now be described in detail with reference to the following examples. However, these examples are only for illustrative purposes and are not intended to limit the scope of the one or more embodiments of the present disclosure.

PREPARATION EXAMPLE 1

Preparation of Graphene Quantum Dots

In preparing Example 1, 20 mg of graphite (available from Aldrich Co., Ltd.) and 100 mg of potassium sodium tartrate were added to an autoclave vessel and then reacted at a temperature of 250° C. for about 60 minutes.

Once the reaction was complete, the resultant was centrifuged using a centrifugal filter (8,000 nominal molecular weight limit (NMWL) and 10,000 NMWL, Amicon Ultra-15) to sort out a particle size, which was then subjected to dialysis to remove residues. Then the resultant was dried to thereby obtain graphene quantum dots (GQDs) in a sheet form having a major-axis length of about 7 nm.

PREPARATION EXAMPLE 2

Preparation of Graphene Quantum Dots

In preparing Example 2, 20 mg of graphite (available from Alfa Aesar Co., Ltd.) was dissolved in 100 mL of concentrated sulfuric acid, and the mixture was sonicated for about 1 hour. 1 g of $KMnO_4$ was added to the resulting mixture, and a temperature of the reaction mixture was adjusted to be about 25° C. or lower.

Microwaves (having a power of about 600 W) were applied to the resultant at an atmospheric pressure (1 atm) under reflux for about 10 minutes. The reaction mixture was cooled down to adjust a temperature of the reaction mixture to about 25° C., and then 700 mL of deionized water was added to the reaction mixture to dilute the reaction mixture, Next, a sodium hydroxide was added to the reaction mixture in an ice bath to adjust a pH of the reaction mixture to about 7.

The reaction mixture was filtered through a porous membrane having a pore diameter of about 200 nm to separate and remove graphene quantum dots having a large size. The resulting filtrate was subjected to dialysis to remove residues, and the resultant was dried to obtain graphene quantum dots in a sheet form having a major-axis length of about 7 nm.

PREPARATION EXAMPLE 3

Preparation of OH Group-bound Graphene Quantum Dots

In preparing Example 3, 160 mL of nitric acid was added to 2 g of pyrene, and the mixture was refluxed at a temperature of about 80° C. for about 12 hours to obtain a reaction mixture containing 1,3,6-trinitropyrene. The reaction mixture was cooled down to room temperature, and 1 L of deionized water was added to dilute the reaction mixture. Subsequently, the reaction mixture was filtered through a microporous membrane having a pore size of about 0.22 μm. 1.0 g of 1,3,6-trinitropyrene obtained through the filtration was dispersed in 0.6 L of a 0.2M NaOH aqueous solution, and ultrasonic waves (500 W, 40 kHz) were then applied thereto for about 2 hours to obtain a suspension. The obtained suspension was put into an autoclave vessel and then reacted at a temperature of about 200° C. for about 10 hours. The resultant was cooled down to room temperature, and filtered through a microporous membrane having a pore size of about 0.22 μm to remove an insoluble carbon product. The resulting product obtained through the filtration was then subjected to dialysis for 2 hours to obtain OH group-bound graphene quantum dots in a sheet form having a major-axis length of about 7 nm.

The graphene quantum dots prepared in Preparation Examples 1 and 3 had a structure including an oxygen-containing functional group at an edge thereof. The graphene quantum dots prepared in Preparation Example 2 had a structure including an oxygen-containing functional group both at an edge and plane of graphene quantum dots due to the use of microwaves during the preparation process.

PREPARATION EXAMPLE 4

Preparation of COOH-functionalized Graphene Quantum Dots

In preparing Example 4, chloroacetic acid was added to the OH group-bound graphene quantum dots prepared in Preparation Example 3, followed by heat treatment at a temperature of 80° C. for 60 minutes, and then a coupling reaction to thereby obtain COOH-functionalized graphene quantum dots having a major-axis length of about 7 nm.

EXAMPLE 1

Preparation of Pellicle Composition

N-methyl-2-pyrrolidone and dimethylformamide (DMF) were added to the graphene quantum dots of Preparation Example 3 to prepare a pellicle composition. The amount of the graphene quantum dots was about 5 wt % based on a total weight of the pellicle composition, and a mixed volume ratio of N-methyl-2-pyrrolidone to dimethylformamide was about 1:1.

EXAMPLES 2-3

Preparation of Pellicle Composition

Pellicle compositions were prepared in the same manner as in Example 1, except that the amount of the graphene quantum dots was changed to about 1 wt % and about 40 wt %, respectively.

EXAMPLE 4

Preparation of Pellicle Composition

A pellicle composition was prepared in the same manner as in Example 1, except that the graphene quantum dots of Preparation Example 4 were used instead of the graphene quantum dots of Preparation Example 3.

COMPARATIVE EXAMPLE 1

Preparation of Pellicle Composition

A pellicle composition was prepared in the same manner as in Example 1, except that graphite was used instead of the graphene quantum dots of Preparation Example 3.

COMPARATIVE EXAMPLE 2

Preparation of Pellicle Composition

A pellicle composition was prepared in the same manner as in Example 1, except that graphene was used instead of the graphene quantum dots of Preparation Example 3.

MANUFACTURING EXAMPLE 1

Manufacture of Pellicle, Reticle and Exposure Apparatus

Figure 5C:
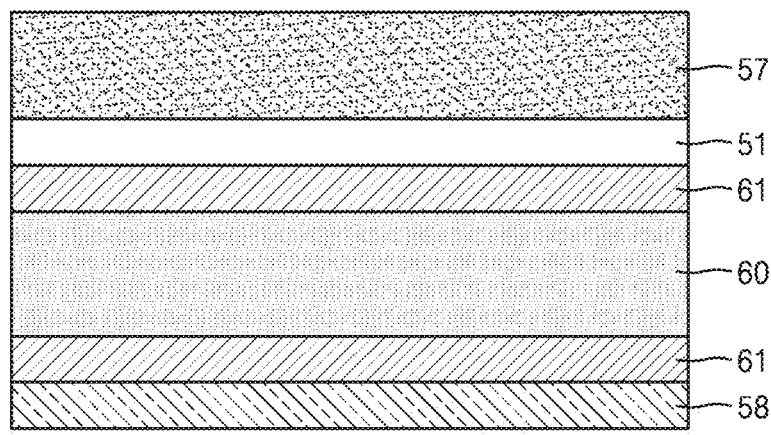
FIGS. 5C to 5E are cross-sectional views illustrating a process of manufacturing a pellicle according to a Manufacturing Example 1.

The pellicle composition prepared in Example 1 was spin-coated on a substrate having a stack structure of a silicon wafer 60 and silicon oxide ($SiO_x$) layers 61 (wherein 0<x≤2 on opposite surfaces of the silicon wafer 60, as illustrated in FIG. 5C) and thermally treated at about 1000° C. for about 1 minute to form a pellicle membrane 51 having a thickness of about 30 nm on the substrate. A silicon oxide (SiO$_x$) layer 57 (wherein 0<x≤2) was formed on a surface of the pellicle membrane 51 (see FIG. 5C).

Figure 5D:
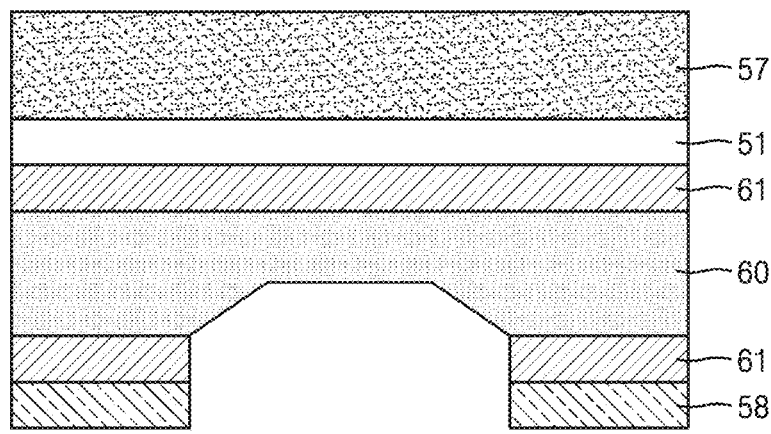
Figure 5E:
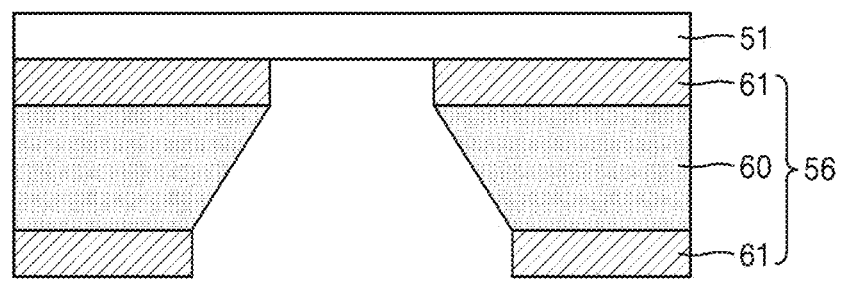

The substrate with the pellicle membrane 51 formed thereon was subjected to rear etching through two steps to etch away a region of the substrate supporting a center region of the pellicle membrane 51, thereby manufacturing a pellicle including the pellicle membrane 51 and the remaining substrate (pellicle frame 56) supporting an edge portion of the pellicle membrane 51 (see FIG. 5E). The pellicle frame 56 had a stack structure of SiO$_x$ layer 61/Si wafer 60/SiO$_x$ layer 61 sequentially stacked in the stated order as illustrated in FIG. 5E.

The rear etching was in two steps: primary etching was performed by reactive ion etching (RIE) using XeF$_2$ gas, as in see FIG. 5D, and secondary etching was performed using HF vapor, as in see FIG. 5E.

The thus-obtained pellicle of Manufacturing Example 1 was arranged in an edge region of a mask pattern such that the pellicle membrane was separated by a distance (d) of about 5 mm from the photomask by the pellicle frame, thereby manufacturing a reticle.

A structure including a substrate and a resist layer on the substrate was prepared. Then, a lens unit was between the reticle and the structure to thereby manufacture an exposure apparatus as illustrated in FIG. 7.

In the exposure apparatus, light emitted from a light source passed through the lens unit via the photomask of the reticle to expose the resist layer on the substrate of the structure, and thus, a pattern corresponding to the mask pattern was transferred onto the resist layer through the exposure process.

MANUFACTURING EXAMPLES 2-3

Pellicles, reticles, and exposure apparatuses including the pellicle and the reticle were manufactured in the same manner as in Manufacturing Example 1, except that the thermal treatment temperature was changed to about 500° C. and about 800° C., respectively.

MANUFACTURING EXAMPLES 4-5

Pellicles, reticles, and exposure apparatuses including the pellicle and the reticle were manufactured in the same manner as in Manufacturing Example 1, except that the pellicle membrane was formed to have a thickness of about 20 nm and about 100 nm, respectively.

MANUFACTURING EXAMPLES 6-8

Pellicles, reticles, and exposure apparatuses including the pellicle and the reticle were manufactured in the same manner as in Manufacturing Example 1, except that the pellicles were formed using the pellicle compositions of Examples 2 to 4, respectively, instead of the pellicle composition of Example 1.

MANUFACTURING EXAMPLES 9-10

Pellicles, reticles, and exposure apparatuses including the pellicle and the reticle were manufactured in the same manner as in Manufacturing Example 1, except that the thermal treatment was performed at about 1000° C. for about 30 minutes and for about 1 hour, respectively, to form the pellicle membrane.

MANUFACTURING EXAMPLE 11

A pellicle, a reticle, and an exposure apparatuses including the pellicle and the reticle were manufactured in the same manner as in Manufacturing Example 1, except that the thermal treatment was performed at about 400° C. for about 1 minute to form a pellicle membrane having a thickness of about 50 nm.

COMPARATIVE MANUFACTURING EXAMPLES 1-2

Pellicles, reticles, and exposure apparatuses including the pellicle and the reticle were manufactured in the same manner as in Manufacturing Example 1, except that the pellicle compositions of Comparative Examples 1 and 2 were used, respectively, instead of the pellicle composition of Example 1.

EVALUATION EXAMPLE 1

Transmission Electron Microscopy (TEM)

The pellicle membrane formed according to Manufacturing Example 1 was analyzed using a FEI Titan cubed 60-300 transmission electron microscope (TEM). The resulting TEM images are shown in FIGS. 8A to 8E and FIG. 9. FIGS. 8B, 8C, 8D, and 8E are magnified TEM images of a circled region in FIG. 8A. FIG. 8F is a size distribution plot of graphene quantum dots in the pellicle membrane.

Figure 8A:
FIG. 8A is a transmission electron microscope (TEM) image of a cross-section of the pellicle membrane formed according to Manufacturing Example 1.
Figure 8B:
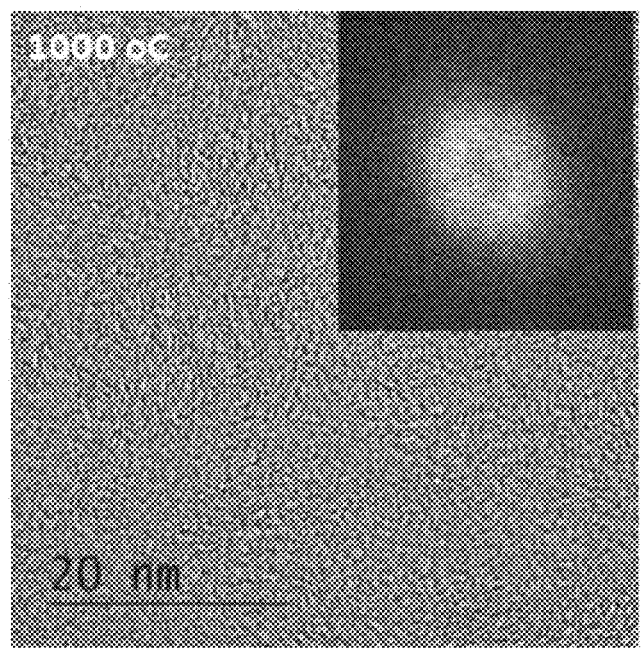
FIGS. 8B, 8C, 8D, and 8E are magnified TEM images of a circled region in FIG. 8A.
Figure 8C:
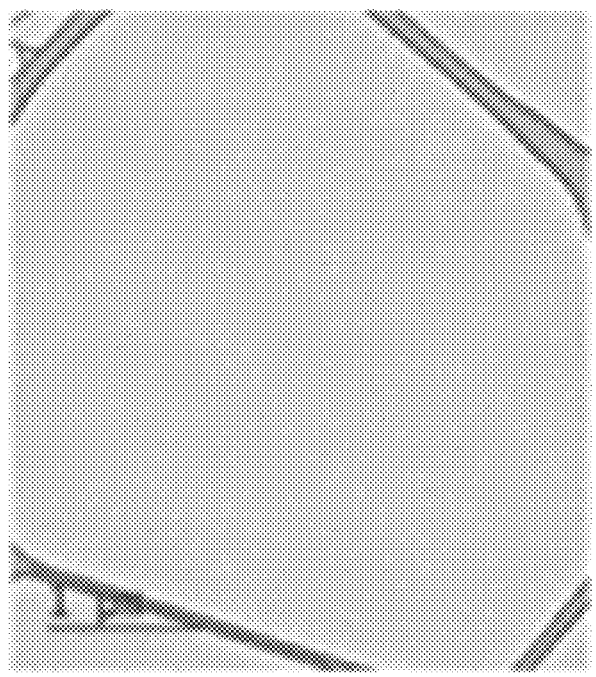
Figure 8D:
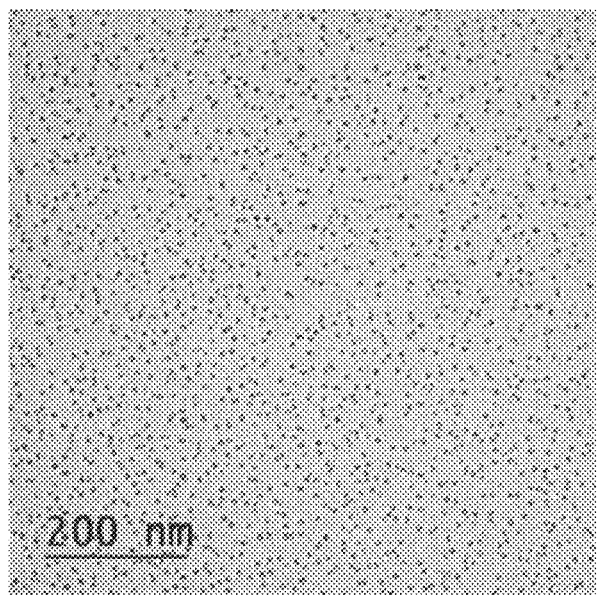
Figure 8E:
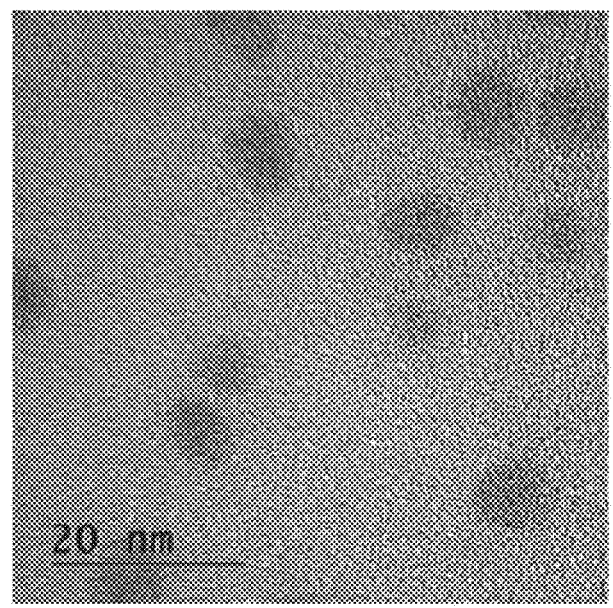
Figure 8F:
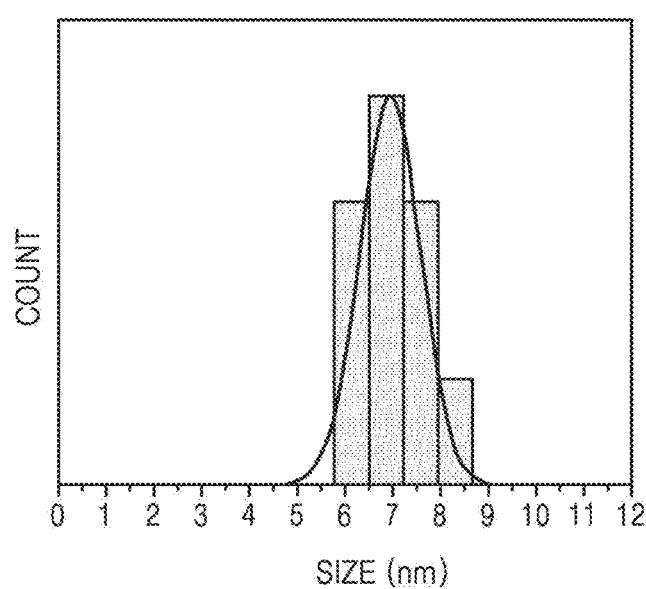
FIG. 8F is a size distribution plot of the graphene quantum dots in the pellicle membrane of Manufacturing Example 1.

Referring to FIG. 8A, the pellicle membrane formed according to Manufacturing Example 1 was found to be as a uniform thin film having a thickness of 50 nm. Referring to FIGS. 8C, 8D, and 8E, uniformly distributed graphene quantum dots without impurities and the sizes thereof were found. FIG. 8F shows a distribution of sizes of the graphene quantum dots. Referring to FIG. 8F, the graphene quantum dots were found to have a uniform size with a narrow size distribution.

Figure 9:
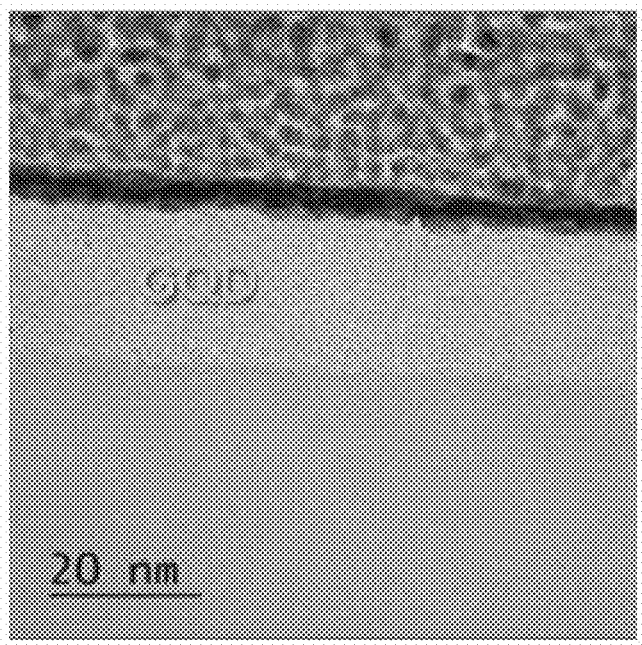
FIG. 9 is a transmission electron microscope (TEM) image of a cross-section of the pellicle membrane formed according to Manufacture Example 1.

In FIG. 9, a carbon film appears adjacent on the GQD and a platinum film appears on the carbon film. The carbon film and the platinum film were formed for TEM analysis.

EVALUATION EXAMPLE 2

Transmittance and Transmittance Uniformity

EUV transmittance and transmittance uniformity of the pellicle membrane formed according to Manufacturing Example 1 were analyzed using an analyzer (EUVO 40, available from FST Corp.). The analysis results are shown in Table 1.

TABLE 1

| Example | EUV wavelength | Transmittance (%) |
|---|---|---|
| Manufacturing Example 1 | 56 nm | 74.15 |
| | 20 nm | 90 |

Referring to Table 1, the pellicle membrane of Manufacturing Example 1 was found to have transmittance characteristics for EUV light.

Transmittance uniformities of the pellicle membranes of Manufacturing Example 1 and Comparative Manufacturing Examples 1-2 were measured. As a result, the pellicle membrane of Manufacturing Example 1 was found to have improved transmittance uniformity compared to the pellicle membranes of Comparative Manufacturing Examples 1-2. The transmittance uniformity is evaluated using the transmittance deviation. The smaller the transmittance deviation is, the better the uniformity of the transmittance is.

EUV transmittances and transmittance uniformities of the pellicle membranes of Manufacturing Examples 9-10 were also evaluated using the above-described same method as applied to the pellicle membrane of Manufacturing Example 1. As a result, the pellicle membranes of Manufacturing Examples 9-10 were found to have similar transmittance and similar transmittance uniformity characteristics to those of the pellicle membrane of Manufacturing Example 1.

EVALUATION EXAMPLE 3

Film Uniformity

Thicknesses of the pellicle membrane having a mean thickness of about 99.77 nm of Manufacturing Example 5 at different positions were measured to evaluate film uniformity of the pellicle membrane. The results are shown in FIG. 10.

The thicknesses of the pellicle membrane were measured by ellipsometry with a Spectroscopic Ellipsometer (Elli-SE-U, available from Ellipso Technology) according to the manufacturers manual. After randomly selecting about 15 to 20 positions on the pellicle membrane inwards about 10 cm from a coating start position, the thickness at each position was measured using the above-described method, and a (+) or (−) thickness deviation at each position with respect to an average thickness of the pellicle membrane was calculated.

Figure 10:
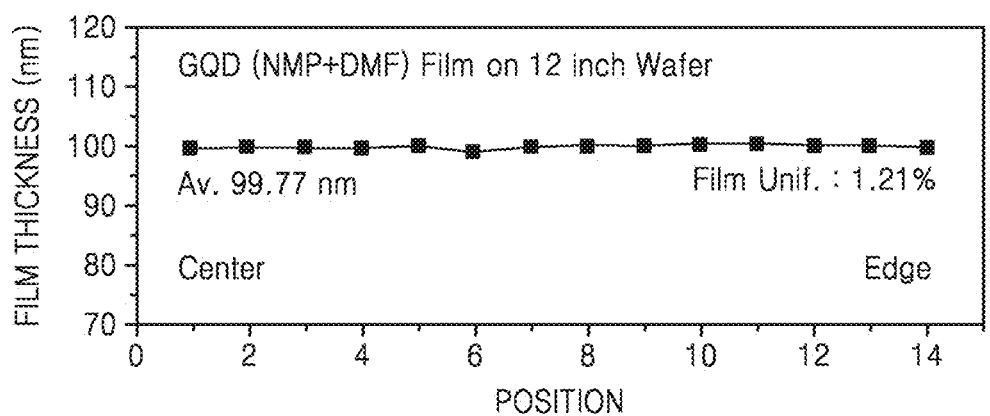
FIG. 10 is a graph illustrating results of film uniformity of thicknesses at different positions on a pellicle membrane formed according to Manufacturing Example 1.

Referring to FIG. 10, the pellicle membrane of Manufacturing Example 5 was found to have an improved film uniformity of about 1.21%.

EVALUATION EXAMPLE 4

Ultimate Strength

Ultimate strengths of the pellicle membranes of Manufacturing Examples 1, 11, and Comparative Manufacturing Example 2 were evaluated. To evaluate the strength of the pellicle membrane with respect to pressure change, after the pellicle membrane of Manufacturing Example 1 as a free-standing pellicle membrane sample was loaded into a chamber, a pressure change rate was measured while varying the pressure using a Baratron gauge available from MKS Corporation Ltd. The ultimate strength evaluation results are shown in Table 2.

TABLE 2

| Example | Ultimate strength (MPa) |
| --- | --- |
| Manufacturing Example 1 | 630 |
| Manufacturing Example 11 | 630 |
| Comparative Manufacturing Example 2 | 130 |

Referring to Table 2, the pellicle membranes of Manufacturing Examples 1 and 11 were found to have an improved ultimate strength, relative to the pellicle membrane of Comparative Manufacturing Example 2.

EVALUATION EXAMPLE 5

Surface Roughness

Surface roughness of the pellicle membranes of Manufacturing Example 1 and Manufacturing Example 11 were evaluated using an atomic force microscopy (AFM). The surface roughness evaluation results are shown in Table 3.

TABLE 3

| Example | Surface roughness (RMS) |
| --- | --- |
| Manufacturing Example 1 | 0.611 nm |
| Manufacturing Example 11 | 1.52 nm |

Referring to Table 3, the pellicle membranes of Manufacturing Examples 1 and 11 were found to have good surface roughness characteristics.

EVALUATION EXAMPLE 6

Rutherford Backscattering Spectrometry (RBS) and Density Analysis

The graphene quantum dots in the pellicle membrane formed according to Manufacturing Example 1 were analyzed by Rutherford backscattering spectrometry (RBS). The RBS results are shown in Table 4. For comparison, the results of photoemission spectroscopy on the graphene quantum dots (GQD) in the pellicle composition used to form the pellicle membrane are shown in Table 4, together with the RBS results of the pellicle membrane of Manufacturing Example 1 and the densities thereof.

TABLE 4

| Example | C (atom %) | N (atom %) | O (atom %) | H (atom %) | Density (g/cm$^3$) |
| --- | --- | --- | --- | --- | --- |
| Manufacturing Example 1 | 91.36 | 1.04 | 4.1 | 3.5 | 2.1 |
| Starting material GQD (GQD of Preparation Example 3) | 57.9 | 2.0 | 8.8 | 31.3 | 1.35 |
| Comparative Manufacturing Example 1 (graphite) | ~99.9 | — | <0.1 | — | 2.2 |

Referring to Table 4, the content ratios of carbon, nitrogen, oxygen, and hydrogen in the pellicle membrane after the heat treatment and in the GQDs before the heat treatment to form the pellicle membrane were found. After the thermal treatment, the content of carbon was relatively increased, while the content of oxygen was relatively decreased.

The pellicle membrane of Manufacturing Example 1 was found to have improved density characteristics nearly the same as graphite.

EVALUATION EXAMPLE 7

X-ray Photoelectron Spectroscopy (XPS)

The pellicle membranes of Manufacturing Example 1 and Comparative Manufacturing Example 1 were analyzed by X-ray photoelectron spectroscopy (XPS) using a Quantum 2000 (available from Physical Electronics Inc., Acceleration voltage: about 0.5~15 keV, 300 W, Energy resolution: about 1.0 eV, Sputtering rate: about 0.1 nm/min).

According to XPS results, the ratios of $sp^2$ carbon to $sp^3$ carbon were found by XPS D-parameter analysis. The pellicle membrane of Manufacturing Example 1 after the thermal treatment at about 1000° C. was found to have a D-parameter of about 21.85 eV and include about 98.9% of $sp^2$ C and about 1.1% of $sp^3$ C.

However, the pellicle membrane of Comparative Manufacturing Example 1 includes including graphite was found to include 100% $sp^2$C (ID-parameter: about 22.1 eV).

EVALUATION EXAMPLE 8

Raman Spectroscopy

GQDs in the pellicle membrane of Manufacturing Example 1 were analyzed by Raman spectroscopy using a Raman 2010 Spectra (available from NT-MDT Development Co., Laser system: 473 nm, 633 nm, and 785 nm, Lowest Raman shift: about 50 $cm^{-1}$, Spatial resolution: about 500 nm). Graphite used to form the pellicle membrane of Comparative Manufacturing Example 1 was analyzed by Raman spectroscopy. The results of the Raman spectroscopy analysis are shown in Table 5. In Table 5, D, G, and 2D bands are peaks at a wave number of about 1,350 $cm^{-1}$, about 1,580 $cm^{-1}$, and about 2,700 $cm^{-1}$, respectively.

TABLE 5

| Example | D/G | 2D/G |
| --- | --- | --- |
| Comparative Manufacturing Example 1 (graphite) | ~0 | >0.5 |
| Starting material GQD (GQD of Preparation Example 3) | >0.5 | about 0.1 |
| Manufacturing Example 1 | ~0.9 | about 0.1 |

EVALUATION EXAMPLE 9

X-ray Diffraction (XRD) Analysis

Figure 11:
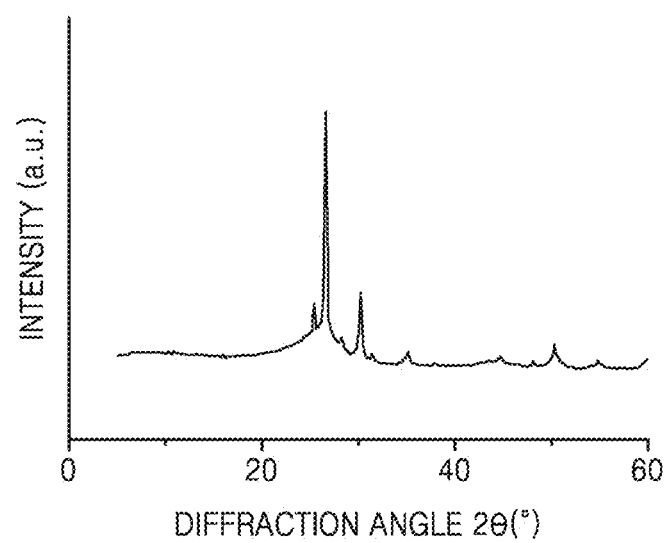
FIG. 11 illustrates results of X-ray diffraction (XRD) analysis of the graphene quantum dots used in the pellicle membrane of Manufacturing Example 1.

GQDs used to form the pellicle membrane of Manufacturing Example 1 and graphite used to form the pellicle membrane of Comparative Manufacturing Example 1 were analyzed by X-ray diffraction (XRD) analysis with CuKα radiation. The XRD results are shown in Table 6 and FIG. 11. FIG. 11 illustrates X-ray diffraction spectra of the GQDs used to form the pellicle membrane of Manufacturing Example 1.

According to the results of X-ray diffraction analysis with CuKα radiation, the GQDs had a 2-dimensional layered structure with a peak from the (002) crystal plane. The (002) crystal plane peak appeared in a range of 2θ as represented in Table 6.

In Table 6, FWHM is a full width at half maximum of the (002) crystal plane peak, and d002 is an interlayer distance (d-spacing).

TABLE 6

| Example | 2θ | FWHM (°) | d002 (Å) |
| --- | --- | --- | --- |
| Comparative Manufacturing Example 1 (graphite) | 25.55 | — | 3.35 |
| Manufacturing Example 1 (GQD) | <26, ~10 | 0.297 | >3.4 |

Referring to Table 6, the GQDs in the pellicle membrane of Manufacturing Example 1 were found to have a 2-dimensional layered structure with a (002) crystal plane peak.

Figure 12:
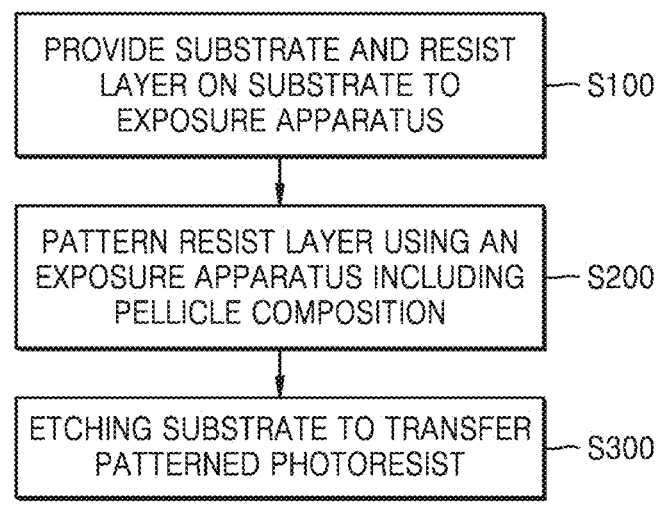
FIG. 12 illustrates a method of manufacturing a device using the exposure apparatus.

FIG. 12 describes a method of manufacturing a device, according to example embodiments. The device may be or may include a semiconductor device; however, inventive concepts are not limited thereto. The substrate may include a wafer, for example, a silicon wafer; however, inventive concepts are not limited thereto.

Referring to FIG. 12, in step S100, a substrate 77 may be provided to the exposure apparatus 80. The substrate 77 may have the resist layer 78 on top.

In step S200, the exposure apparatus 80 may pattern an image on the resist layer 78, using a reticle 74 that includes a pellicle 70, to form a patterned resist layer.

In step S300, the substrate 77 may be etched, transferring the patterned image into the substrate.

As described above, according to the one or more embodiments, using a pellicle composition according to any of the above-described embodiments, a pellicle membrane which may be as a free-standing membrane due to having improved extreme ultraviolet (EUV) transmittance characteristics and improved ultimate strength may be obtained. A reticle using the pellicle membrane, and an exposure apparatus using the reticle may also be obtained.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A pellicle composition, comprising:
    a graphene quantum dot compound; and
    a solvent,
    wherein the graphene quantum dot compound includes at least one selected from graphene quantum dots having a diameter or major axis of about 50 nm or less, or a graphene quantum dot precursor, and
    the graphene quantum dots have a hydrophilic property.
2. The pellicle composition of claim 1, wherein the graphene quantum dots have at least one defect.
3. The pellicle composition of claim 2, wherein the graphene quantum dots having at least one defect have at least one element selected from an $sp^3$ carbon and a carbon vacancy.
4. The pellicle composition of claim 1, wherein the graphene quantum dots have at an edge thereof,
    at least one functional group selected from the group consisting of a hydroxyl group, a carbonyl group, a carboxyl group, an epoxy group, an amine group, and an imide group, or
    a functional group including at least one heteroatom selected from oxygen and nitrogen.
5. The pellicle composition of claim 1, wherein in the graphene quantum dots, i) an amount of oxygen is in a range of about 0.1 atom % to about 50 atom %, an amount of carbon is in a range of about 30 atom % to about 99 atom %, and an amount of hydrogen is in a range of about 0.1 atom % to about 40 atom %; or
    ii) an amount of oxygen is in a range of about 0.1 atom % to about 50 atom %, an amount of carbon is in a range of about 30 atom % to about 99 atom %, an amount of nitrogen is in a range of about 0.5 atom % to about 40 atom %, and an amount of hydrogen is in a range of about 0.1 atom % to about 40 atom %.

6. The pellicle composition of claim 1, wherein an amount of the graphene quantum dot compound is in a range of about 0.1 wt % to about 40 wt % based on a total weight of the pellicle composition.

7. The pellicle composition of claim 1, wherein the graphene quantum dots have an intensity ratio ($I_D/I_G$) of a D mode peak to a G mode peak of about 0.5 or greater, and an intensity ratio ($I_{2D}/I_G$) of a 2D mode peak to a G mode peak of about 0.01 or greater, as analyzed by Raman spectroscopy.

8. The pellicle composition of claim 1, wherein the graphene quantum dots have a peak from a (002) crystal plane at about 20° to about 27°, as analyzed by X-ray diffraction analysis, and an interlayer distance of about 0.3 nm to about 0.5 nm.

9. The pellicle composition of claim 1, wherein the graphene quantum dots have a size of about 0.1 nm to about 30 nm.

10. The pellicle composition of claim 1, wherein the solvent is at least one selected from water, methanol, isopropanol, ethanol, N,N-dimethylformamide, N-methyl-2-pyrrolidone, dichloroethane, dichlorobenzene, dimethylsulfoxide, xylene, aniline, propylene glycol, propylene glycol diacetate, 3-methoxy-1,2-propanediol, diethylene glycol, acetylacetone, cyclohexanone, propylene glycol monomethyl ether acetate, γ-butyrolactone, nitromethane, tetrahydrofuran, nitrobenzene, butyl nitrite, methyl cellosolve, ethyl cellosolve, diethylether, diethylene glycol methyl ether, diethylene glycol ethyl ether, dipropylene glycol methyl ether, toluene, hexane, methylethylketone, methyl isopropylketone, hydroxymethylcellulose, propylene glycol methyl ether acetate (PGMEA), and heptane.

11. The pellicle composition of claim 1, further comprising:
   i) at least one first material selected from a two-dimensional (2D) carbon nanostructure, a zero-dimensional (0D) carbon nanostructure, a 2D carbon nanostructure precursor, and a 0D carbon nanostructure precursor;
   ii) at least one second material selected from an aromatic ring-containing monomer and a polymer containing a repeating unit including the aromatic ring-containing monomer;
   iii) at least one third material selected from the group consisting of a hexagonal boron nitride derivative, a chalcogenide material, a hexagonal boron nitride derivative precursor, and a chalcogenide material precursor;
   iv) at least one fourth material selected from a silicon derivative and a metal oxide; or
   a combination thereof.

12. The pellicle composition of claim 11, wherein the 2D carbon nanostructure is at least one selected from graphene, reduced graphene oxide, a derivative of any of the graphene and the reduced graphene oxide, and a heteroatom derivative of any of the graphene and the reduced graphene oxide, and the 0D carbon nanostructure is at least one selected from fullerene, boron buckyball, carborane, and a derivative of any of the fullerene, the boron buckyball, and the carborane.

13. A pellicle, comprising:
   a pellicle membrane including a product obtained by coating and thermally treating the pellicle composition of claim 1.

14. The pellicle of claim 13, wherein the product obtained by coating and thermally treating the pellicle composition comprises at least one selected from the graphene quantum dots and a reaction product thereof.

15. The pellicle of claim 14, wherein in the at least one selected from the graphene quantum dots and a reaction product thereof,
   i) an amount of oxygen is in a range of about 0.1 atom % to about 40 atom %, an amount of carbon is in a range of about 59 atom % to about 99 atom %, and an amount of hydrogen is in a range of about 0.1 atom % to about 10 atom %; or
   ii) an amount of oxygen is in a range of about 0.1 atom % to about 40 atom %, an amount of carbon is in a range of about 59 atom % to about 99atom %, an amount of nitrogen is in a range of about 0.5 atom % to about 40 atom %, and an amount of hydrogen is in a range of about 0.1 atom % to about 40 atom %.

16. The pellicle of claim 13, wherein the pellicle has an extreme-ultraviolet (EUV) light transmittance of about 70% or greater, and a transmittance uniformity deviation of about 1% or less.

17. The pellicle of claim 13, wherein the pellicle membrane has a density of about 1.3 g/cm$^3$ to about 2.5 g/cm$^3$ and an ultimate strength of about 200 MPa or greater.

18. The pellicle of claim 13, further comprising a pellicle frame at an edge region of a photomask, the pellicle frame supporting the pellicle membrane.

19. The pellicle of claim 18, further comprising an adhesive layer between the pellicle membrane and the pellicle frame.

20. The pellicle of claim 13, wherein at least one selected from a passivation layer and a protective layer is on at least one surface of the pellicle membrane.

21. The pellicle of claim 13, wherein the pellicle is for an extreme ultraviolet (EUV) lithography apparatus.

22. A reticle comprising:
   a photomask; and
   the pellicle of claim 13.

23. The reticle of claim 22, wherein the reticle is for an extreme ultraviolet (EUV) lithography apparatus.

24. An exposure apparatus for lithography comprising:
   a light source configured to emit light; and
   the reticle of claim 22 located in a path of light emitted from the light source.

25. The exposure apparatus of claim 24, further comprising at least one optical member between the light source and the reticle.

26. The exposure apparatus of claim 24, wherein the exposure apparatus is an extreme ultraviolet (EUV) exposure apparatus.

27. A method of forming a pellicle membrane, the method comprising:
   providing the pellicle composition according to claim 1 onto a substrate and thermally treating the pellicle composition to form the pellicle membrane on the substrate; and
   etching away a central region of the substrate supporting the pellicle membrane, such that the pellicle membrane remains.

28. The method of claim 27, wherein the thermal treatment is performed at a temperature of about 200° C. to about 2000° C.

29. The method of claim 27, wherein the pellicle composition is provided using a method selected from spin coating, screen printing, a doctor-blade process, spray coating, electrospraying, dip coating, and bar coating.

* * * * *